(12) United States Patent
Fukui et al.

(10) Patent No.: US 11,569,279 B2
(45) Date of Patent: Jan. 31, 2023

(54) SOLID-STATE IMAGING DEVICE, METHOD OF MANUFACTURING SOLID-STATE IMAGING DEVICE, AND ELECTRONIC APPARATUS

(71) Applicant: SONY SEMICONDUCTOR SOLUTIONS CORPORATION, Kanagawa (JP)

(72) Inventors: Hironobu Fukui, Kanagawa (JP); Hirofumi Yamashita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 177 days.

(21) Appl. No.: 16/757,249

(22) PCT Filed: Sep. 14, 2018

(86) PCT No.: PCT/JP2018/034095
§ 371 (c)(1),
(2) Date: Apr. 17, 2020

(87) PCT Pub. No.: WO2019/082546
PCT Pub. Date: May 2, 2019

(65) Prior Publication Data
US 2021/0193711 A1    Jun. 24, 2021

(30) Foreign Application Priority Data

Oct. 27, 2017    (JP) .............................. JP2017-207725

(51) Int. Cl.
*H01L 27/146*       (2006.01)
*H01L 27/148*       (2006.01)

(52) U.S. Cl.
CPC .. *H01L 27/14612* (2013.01); *H01L 27/14636* (2013.01); *H01L 27/14689* (2013.01); *H01L 27/14831* (2013.01); *H01L 27/14603* (2013.01)

(58) Field of Classification Search
CPC ......... H01L 27/14612; H01L 27/14603; H01L 27/14614
See application file for complete search history.

(56) References Cited

U.S. PATENT DOCUMENTS 8,748,945 B2 *   6/2014   Shin .................... H01L 27/1464
                                                          257/241
9,240,512 B2 *   1/2016   Kim ................... H01L 27/14687
(Continued)

FOREIGN PATENT DOCUMENTS

CN        101136367 A        3/2008
CN        102629614 A        8/2012
(Continued)

OTHER PUBLICATIONS

International Search Report and Written Opinion of PCT Application No. PCT/JP2018/034095, dated Nov. 6, 2018, 09 pages of ISRWO.

*Primary Examiner* — David A Zarneke
(74) *Attorney, Agent, or Firm* — Chip Law Group

(57) ABSTRACT

There is provided a solid-state imaging device that includes a photoelectric conversion unit, a transfer gate, a floating diffusion unit, and a transistor. The photoelectric conversion unit produces a charge according to incident light. The transfer gate has a columnar shape having an opening that is continuous in a vertical direction, and transfers the charge from the photoelectric conversion unit. The floating diffusion unit is formed extending to a region surrounded by the opening of the transfer gate, and converts the transferred (Continued)

charge into a voltage signal. The transistor is electrically connected to the floating diffusion unit via a diffusion layer.

11 Claims, 28 Drawing Sheets

(56) References Cited

U.S. PATENT DOCUMENTS

| | | | |
|---|---|---|---|
| 11,322,533 B2* | 5/2022 | Yamakawa | ....... H01L 27/14689 |
| 2008/0057615 A1 | 3/2008 | Okagawa et al. | |
| 2012/0199882 A1 | 8/2012 | Shin | |
| 2014/0252420 A1* | 9/2014 | Yi | ....................... H01L 27/1463 |
| | | | 257/229 |
| 2016/0020236 A1 | 1/2016 | Tanaka et al. | |
| 2016/0020237 A1 | 1/2016 | Yamakawa | |
| 2016/0204153 A1 | 7/2016 | Tayanaka | |

FOREIGN PATENT DOCUMENTS

| | | |
|---|---|---|
| CN | 104981906 A | 10/2015 |
| CN | 104995734 A | 10/2015 |
| CN | 105474394 A | 4/2016 |
| DE | 102011055527 A1 | 8/2012 |
| EP | 1895591 A2 | 3/2008 |
| JP | 2008-085304 A | 4/2008 |
| JP | 2012-114479 A | 6/2012 |
| JP | 2012-164971 A | 8/2012 |
| JP | 2014-199898 A | 10/2014 |
| JP | 2015-046477 A | 3/2015 |
| KR | 10-2012-0090352 A | 8/2012 |
| KR | 10-2014-0111492 A | 9/2014 |
| KR | 10-2015-0130266 A | 11/2015 |
| KR | 10-2016-0048066 A | 5/2016 |
| TW | 201436182 A | 9/2014 |
| WO | 2014/141621 A1 | 9/2014 |
| WO | 2014/141900 A1 | 9/2014 |
| WO | 2015/029798 A1 | 3/2015 |

* cited by examiner

SOLID-STATE IMAGING DEVICE, METHOD OF MANUFACTURING SOLID-STATE IMAGING DEVICE, AND ELECTRONIC APPARATUS

CROSS REFERENCE TO RELATED APPLICATIONS

This application is a U.S. National Phase of International Patent Application No. PCT/JP2018/034095 filed on Sep. 14, 2018, which claims priority benefit of Japanese Patent Application No. JP 2017-207725 filed in the Japan Patent Office on Oct. 27, 2017. Each of the above-referenced applications is hereby incorporated herein by reference in its entirety.

TECHNICAL FIELD

The present technology relates to a solid-state imaging device. In more detail, the present technology relates to a solid-state imaging device having a transfer gate that transfers a charge produced in a photoelectric conversion unit, a method of manufacturing the solid-state imaging device, and an electronic apparatus.

BACKGROUND ART

In a solid-state imaging device, a charge produced in a photoelectric conversion unit is converted into a voltage signal and transferred to a transistor. At this time, with a reduction in pixel size, it is required to enhance the charge transfer efficiency at the time of reading. Thus, for example, there has been proposed an image sensor in which the charge transfer efficiency is raised by surrounding a charge transfer path in a vertical direction with a vertical gate (for example, see Patent Document 1).

CITATION LIST

Patent Document

Patent Document 1: Japanese Patent Application Laid-Open No. 2012-164971

SUMMARY OF THE INVENTION

Problems to be Solved by the Invention

In the above-mentioned prior art, since the floating diffusion is surrounded by the vertical gate, it is necessary to connect the floating diffusion to the transistor via a contact and a metal layer. Therefore, it is difficult to reduce the area due to layout restrictions.

The present technology has been developed in view of such a situation, and has as its object to reduce the area of a solid-state imaging device while improving the charge transfer efficiency.

Solutions to Problems

The present technology has been made to eliminate the above-mentioned disadvantages, and a first aspect thereof is a solid-state imaging device and an electronic apparatus including: a photoelectric conversion unit that produces a charge according to incident light; a transfer gate that has a columnar shape having an opening that is continuous in a vertical direction, and transfers the charge from the photoelectric conversion unit; a floating diffusion unit that is formed extending to a region surrounded by the opening, and converts the transferred charge into a voltage signal; and a transistor electrically connected to the floating diffusion unit via a diffusion layer. This brings about an action that the floating diffusion unit is electrically connected to the transistor not via a contact.

Furthermore, in this first aspect, the floating diffusion unit is formed integrally with the diffusion layer of the transistor. This brings about an action that the voltage signal converted in the floating diffusion unit is transmitted to the diffusion layer of the transistor not via a contact.

In addition, in the first aspect, the transistor may include a reset transistor, and the diffusion layer of the transistor may include a diffusion layer of a source of the reset transistor. This brings about an action that the voltage signal converted in the floating diffusion unit is transmitted to the diffusion layer of the source of the reset transistor not via a contact.

In addition, this first aspect may further include a contact that electrically connects the floating diffusion unit and a wiring layer to each other. This brings about an action that a connection is made via the wiring layer in addition to the connection to the diffusion layer of the transistor.

In addition, this first aspect may further include another transistor having a gate electrode electrically short-circuited to the floating diffusion unit via the contact. This brings about an action that the transistor is connected to the gate electrode of another transistor via a shared contact.

In addition, in this first aspect, the photoelectric conversion unit and the transfer gate may be each provided for every pixel, and the floating diffusion unit and the transistor may be shared by a plurality of pixels. This brings about an action that a plurality of pixels is allowed to share the floating diffusion unit and the transistor.

In addition, in this first aspect, the transistor may be shared by two pixels on upper and lower sides, and may be disposed in an element isolation region between the two pixels on the upper and lower sides. Furthermore, the transistor may be shared by four pixels on upper, lower, left, and right sides, and may be disposed in an element isolation region between any of the four pixels on the upper, lower, left, and right sides.

In addition, this first aspect may further include: a contact that electrically connects the floating diffusion unit and a wiring layer to each other; and another transistor that has a gate electrode that is electrically short-circuited to the floating diffusion unit via the contact, and is shared by the plurality of pixels. This brings about an action that a connection to the gate electrode of another transistor shared by the plurality of pixels is made via a shared contact.

In addition, this first aspect may further include an element isolation portion having a trench shape that passes through a silicon substrate, and electrically and optically isolates the plurality of pixels from each other. This brings about an action that the pixels are isolated from each other by a deep trench.

Furthermore, a second aspect of the present technology is a method of manufacturing a solid-state imaging device, the method including: a procedure of providing a photoelectric conversion unit in correspondence with a pixel in a semiconductor substrate; a procedure of forming a transfer gate above the photoelectric change unit, the transfer gate having a prismatic shape having an opening in a vertical direction; and a procedure of forming a diffusion layer shared with a transistor by implanting impurity ions into the opening. This brings about an action that a floating diffusion unit electrically connected to the transistor not via a contact is formed.

Effects of the Invention

According to the present technology, an outstanding effect that the area of a solid-state imaging device can be reduced while the charge transfer efficiency is improved can be achieved. Note that the effects described herein are not necessarily limited and any effects described in the present disclosure may be applied.

MODE FOR CARRYING OUT THE INVENTION

Modes for carrying out the present technology (hereinafter, referred to as embodiments) will be described below. The description will be given in the following order.

1. First Embodiment (Example of Sharing Floating Diffusion Region and Diffusion Layer of Reset Transistor)
2. Second Embodiment (Example of Connecting Diffusion Layer and Gate Electrode of Amplification Transistor by Shared Contact)
3. Third Embodiment (Example of Application to Pixels of 2×1 Pixel Arrangement)
4. Fourth Embodiment (Example using Shared Contact in Pixels of 2×1 Pixel Arrangement)
5. Fifth Embodiment (Example of Application to Pixels of 2×2 Pixel Arrangement)

6. Sixth Embodiment (Example using Shared Contact in Pixels of 2×2 Pixel Arrangement)

7. Seventh Embodiment (Example in which Pixels are Isolated from Each Other by Deep Trench Structure)

1. First Embodiment

[Configuration of Solid-State Imaging Device]

Figure 1:
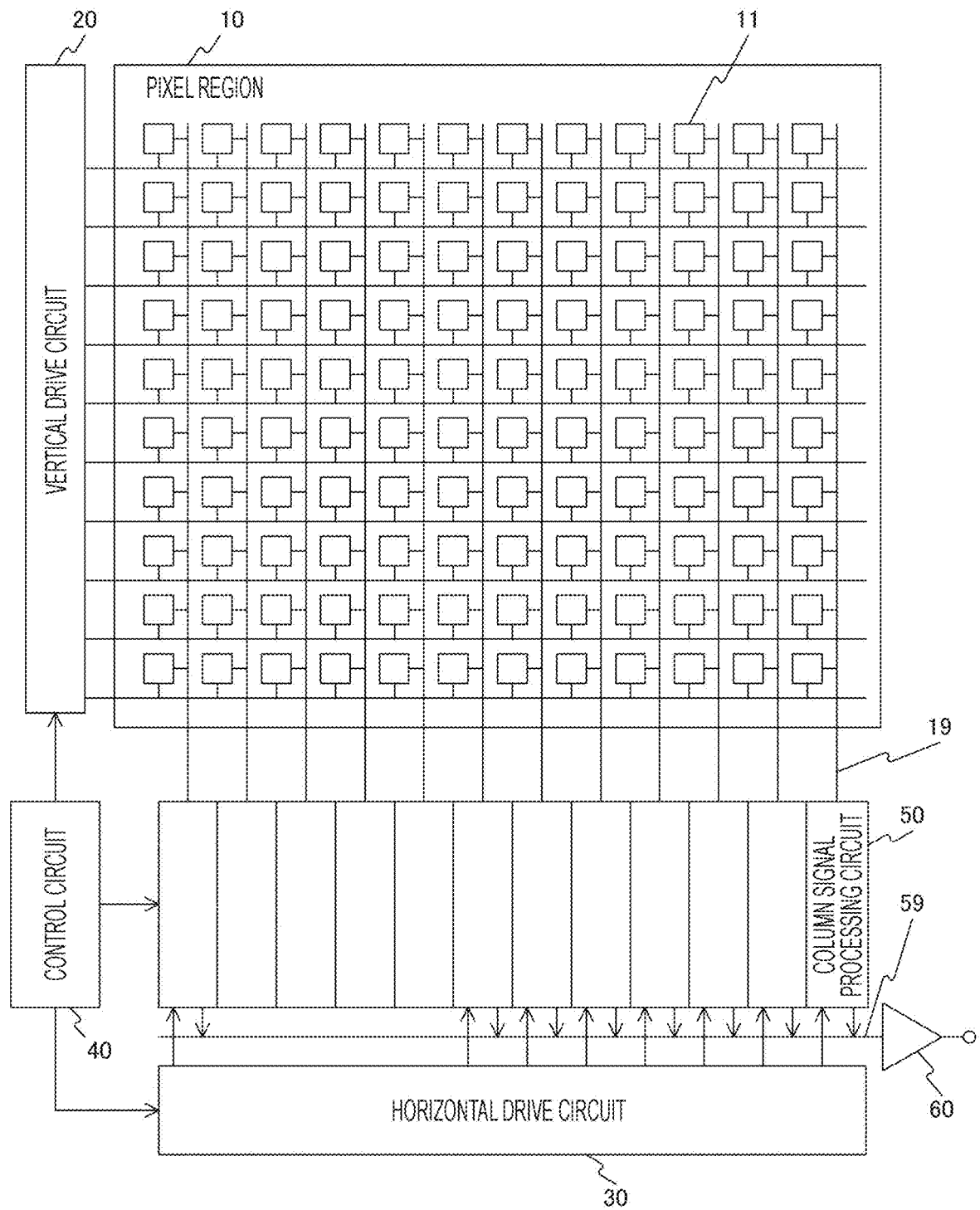
FIG. 1 is a diagram illustrating a configuration example of a solid-state imaging device according to an embodiment of the present technology.

FIG. 1 is a diagram illustrating a configuration example of a solid-state imaging device according to an embodiment of the present technology. This solid-state imaging device is made up of a pixel region 10 and a peripheral circuit unit. The peripheral circuit unit includes a vertical drive circuit 20, a horizontal drive circuit 30, a control circuit 40, a column signal processing circuit 50, and an output circuit 60.

The pixel region 10 contains a pixel array in which a plurality of pixels 11 each including a photoelectric conversion unit is arranged in a two-dimensional array form. This pixel 11 includes, for example, a photodiode serving as a photoelectric conversion unit and a plurality of pixel transistors. Here, the plurality of pixel transistors can be constituted by, for example, four transistors, namely, a transfer transistor, a reset transistor, a select transistor, and an amplification transistor.

The vertical drive circuit 20 drives the pixels 11 in units of rows. This vertical drive circuit 20 is constituted by a shift register, for example. This vertical drive circuit 20 selects pixel drive wiring and supplies a pulse for driving the pixel 11 to the selected pixel drive wiring. With this configuration, the vertical drive circuit 20 sequentially selects and scans the respective pixels 11 in the pixel region 10 in units of rows in a vertical direction, and supplies, to the column signal processing circuit 50 via a vertical signal line 19, a pixel signal based on a signal charge generated in accordance with the amount of received light in the photoelectric conversion unit of each pixel 11.

The horizontal drive circuit 30 drives the column signal processing circuits 50 in units of columns. This horizontal drive circuit 30 is constituted by a shift register, for example. This horizontal drive circuit 30 sequentially outputs a horizontal scanning pulse to select each of the column signal processing circuits 50 in order, and causes each of the column signal processing circuits 50 to output the pixel signal to the output circuit 60 via a horizontal signal line 59.

The control circuit 40 controls the entire solid-state imaging device. This control circuit 40 receives an input clock and data for instructing on an operation mode or the like, and outputs data such as internal information on the solid-state imaging device. In other words, this control circuit 40, on the basis of a vertical synchronization signal, a horizontal synchronization signal, and a master clock, generates a clock signal or a control signal serving as a reference for operation of the vertical drive circuit 20, the column signal processing circuit 50, the horizontal drive circuit 30, and the like. Then, these signals are input to the vertical drive circuit 20, the column signal processing circuit 50, the horizontal drive circuit 30, and the like.

The column signal processing circuit 50 is disposed, for example, for each column of the pixels 11, and performs, for each pixel column, a signal process such as noise removal on signals output from the pixels 11 included in one row. In other words, this column signal processing circuit 50 performs signal processes such as correlated double sampling (CDS) for removing fixed pattern noise unique to the pixel 11, signal amplification, and analog-to-digital (AD) conversion. At the output stage of the column signal processing circuit 50, a horizontal select switch (not illustrated) is connected between the column signal processing circuit 50 and the horizontal signal line 59.

The output circuit 60 performs a signal process on a signal sequentially supplied from each of the column signal processing circuits 50 through the horizontal signal line 59, and outputs the processed signal. At this time, this output circuit 60 buffers the signal from the column signal processing circuit 50. Furthermore, this output circuit 60 may perform black level adjustment, column variation correction, various digital signal processes, and the like on the signal from the column signal processing circuit 50.

[Circuit Configuration of Solid-State Imaging Device]

Figure 2:
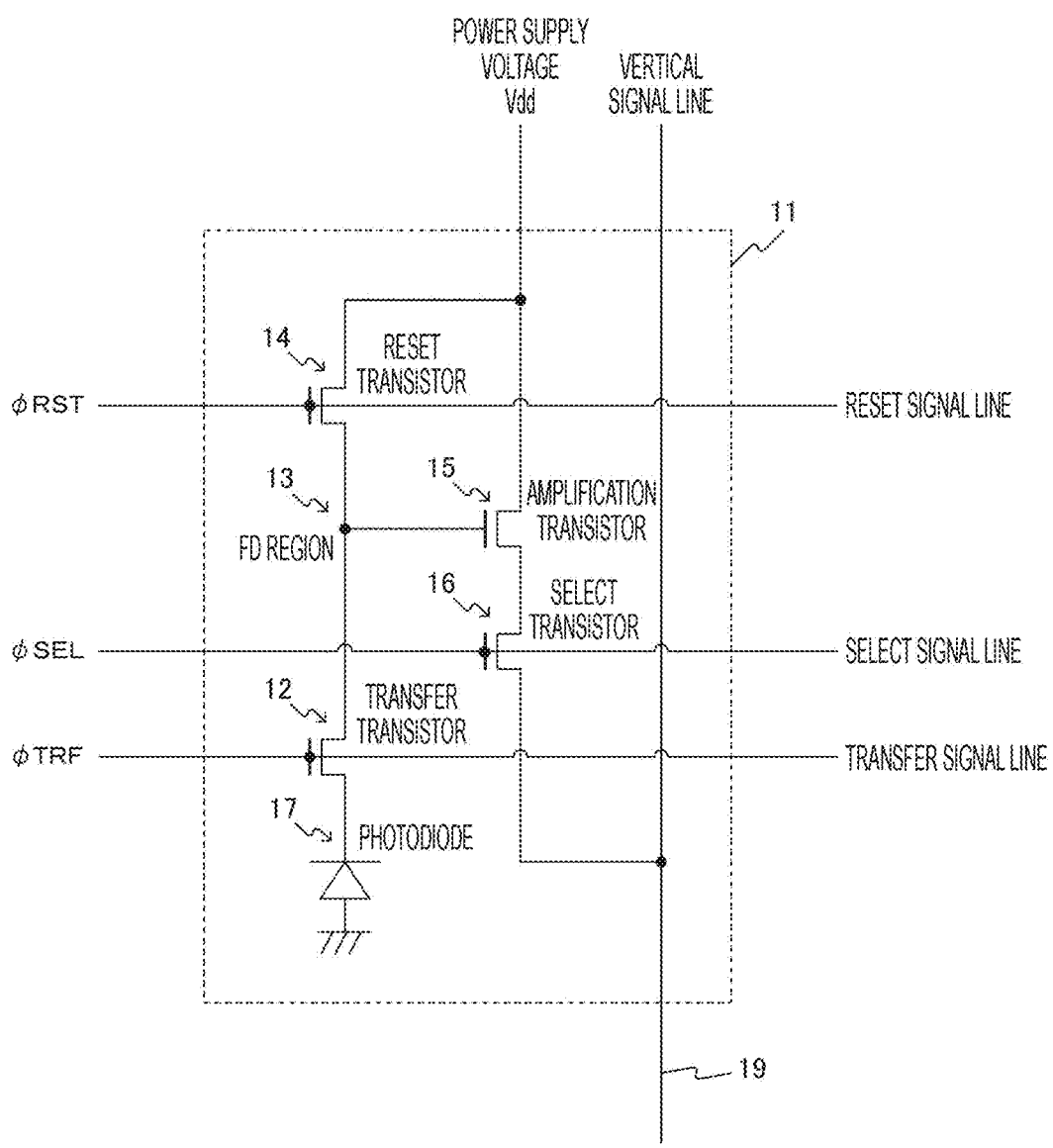
FIG. 2 is a diagram illustrating a circuit configuration example of a pixel 11 according to the embodiment of the present technology.

FIG. 2 is a diagram illustrating a circuit configuration example of the pixel 11 according to the embodiment of the present technology.

The pixel 11 includes a photodiode 17, a transfer transistor 12, a floating diffusion region 13, a reset transistor 14, an amplification transistor 15, and a select transistor 16. These four transistors, namely, the transfer transistor 12, the reset transistor 14, the amplification transistor 15, and the select transistor 16, are referred to as pixel transistors. Note that, in this example, it is assumed that the pixel transistors are each a metal-oxide-semiconductor (MOS) transistor having an N-type carrier polarity.

Furthermore, for the pixel 11, three signal lines, namely, a transfer signal line, a reset signal line, and a select signal line are provided in a row direction, and the vertical signal line 19 is provided in a column direction. In addition, a power supply voltage Vdd is supplied to drain sides of the reset transistor 14 and the amplification transistor 15.

The photodiode (PD) 17 is a photoelectric conversion unit that produces a charge according to incident light. Note that an anode of this photodiode 17 is grounded.

The transfer transistor 12 is a transistor that transfers a charge that has occurred in the photodiode 17. This transfer transistor 12 is provided between a cathode of the photodiode 17 and the floating diffusion region 13. This transfer transistor 12 is put into an ON state when a high-level signal is input to a gate of the transfer transistor 12 from the vertical drive circuit 20 via the transfer signal line, and transfers a charge photoelectrically converted by the photodiode 17 to the floating diffusion region 13.

The floating diffusion (FD) region 13 is a diffusion layer region that converts a charge transferred by the transfer transistor 12 into a voltage signal. The voltage signal of this floating diffusion region 13 is connected to a drain of the reset transistor 14 and a gate of the amplification transistor 15.

The reset transistor 14 is a transistor for resetting the voltage of the floating diffusion region 13. This reset transistor 14 is provided between the power supply voltage Vdd and the floating diffusion region 13. This reset transistor 14 is put into an ON state when a high-level signal is input to the reset signal line to a gate of the reset transistor 14 from the vertical drive circuit 20, and resets the potential of the floating diffusion region 13 to the power supply voltage Vdd.

The amplification transistor 15 is a transistor that amplifies the voltage signal of the floating diffusion region 13. The gate of this amplification transistor 15 is connected to the floating diffusion region 13. The drain of the amplification transistor 15 is connected to the power supply voltage Vdd, and a source of the amplification transistor 15 is connected to the vertical signal line 19 via the select transistor 16. This amplification transistor 15 amplifies the voltage signal of the floating diffusion region 13, and outputs the resulting amplified signal to the select transistor 16 as a pixel signal.

The select transistor 16 is a transistor for selecting this pixel. This select transistor 16 is provided between the amplification transistor 15 and the vertical signal line 19. This select transistor 16 is put into an ON state when a high-level signal is input to the select signal line to a gate of the select transistor 16 from the vertical drive circuit 20, and outputs the voltage signal amplified by the amplification transistor 15 to the vertical signal line 19.

[Structure of Solid-State Imaging Device]

Figure 3:
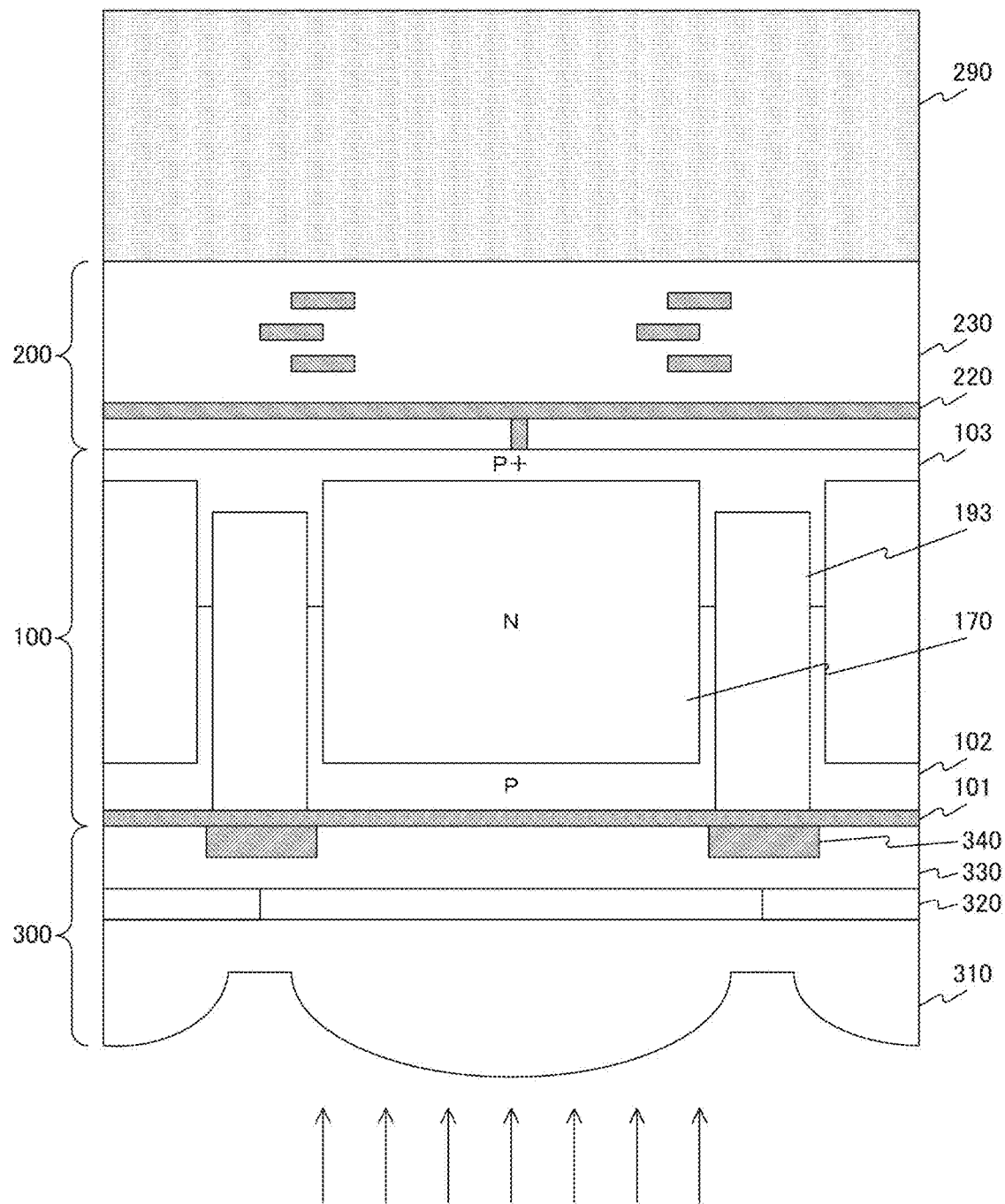
FIG. 3 is a diagram illustrating a schematic example of a cross section of one pixel 11 of the solid-state imaging device according to the embodiment of the present technology.

FIG. 3 is a diagram illustrating a schematic example of a cross section of one pixel 11 of the solid-state imaging device according to the embodiment of the present technology. Here, as an example, a back-illuminated solid-state imaging device is assumed.

In this solid-state imaging device, a photodiode 170 is provided in a portion defined by a trench 193 inside a semiconductor substrate 100. The photodiode 170 has an n-type impurity region provided as a charge storage region. The photodiode 170 is formed as an n-type impurity region in a region sandwiched between P-type semiconductor regions 102 and 103 in a depth direction of the semiconductor substrate 100. Note that the photodiode 170 is an example of a photoelectric conversion unit described in the claims.

Pixel transistors (not illustrated) are provided on a front surface of this semiconductor substrate 100, and a wiring layer 200 is provided so as to coat these pixel transistors. The wiring layer 200 has wiring 220 formed so as to be covered by an insulating layer 230. This wiring 220 can be configured as multilayer wiring made up of a plurality of layers. Then, a support substrate 290 is provided on a front surface of the wiring layer 200.

Meanwhile, on a back surface of the semiconductor substrate 100, a color filter 320 and a microlens 310 are provided via an insulating film 101, which is a silicon oxide film, and a planarization film 330. Incident light incident from the back surface is received by the photodiode 170, and the photodiode 170 produces a charge according to the incident light.

Furthermore, a light shielding film 340 is provided below the trench 193. This light shielding film 340 is formed using a light shielding material such as a metal. This light shielding film 340 is coated by the planarization film 330, and the color filter 320 and the microlens 310 are provided below this planarization film 330. The color filter 320 is, for example, a filter in which respective filter layers of three primary colors are arranged for each pixel in a Bayer arrangement.

Figure 4:
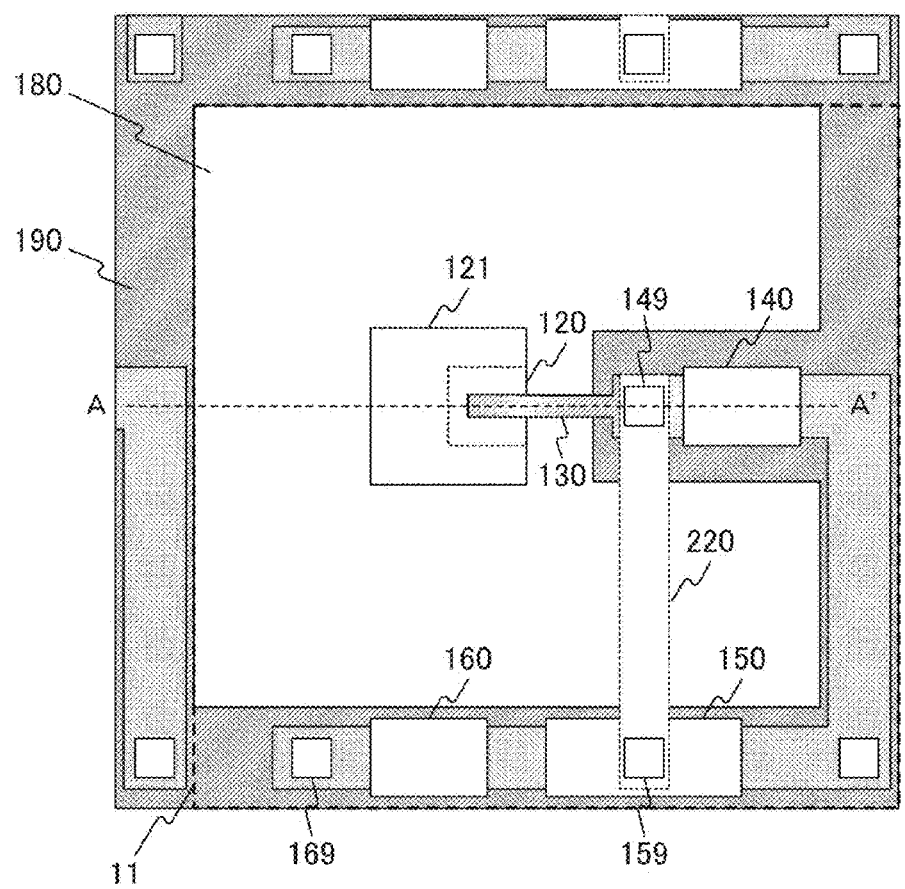
FIG. 4 is an example of a plan view of a semiconductor substrate 100 of a pixel 11 according to a first embodiment of the present technology.

FIG. 4 is an example of a plan view of a semiconductor substrate 100 of a pixel 11 according to a first embodiment of the present technology.

A transfer gate 120 of a transfer transistor that transfers a charge from a photodiode 170 is disposed in the vicinity of the center of the pixel. This transfer gate 120 has a columnar shape and has an opening that is continuous in the vertical direction. In other words, this transfer gate 120 has a U-shape when viewed from the top, and is prolonged in the vertical direction where the photodiode 170 is provided. A contact region 121 for connecting to a wiring layer 200 is provided on an upper surface of this transfer gate 120.

A floating diffusion region 130 is formed extending in a region surrounded by the U-shaped opening of the transfer gate 120. This floating diffusion region 130 converts a charge transferred from the transfer gate 120 into a voltage signal. This floating diffusion region 130 is shared with a diffusion layer region of a source of a reset transistor 140, and is formed integrally. Therefore, it is not necessary to interpose the wiring layer 200 between the floating diffusion region 130 and the source of the reset transistor 140 for connection therebetween. Note that the floating diffusion region 130 is an example of a floating diffusion unit described in the claims. Furthermore, the reset transistor 140 is an example of a transistor described in the claims.

The diffusion layer region of a drain of the reset transistor 140 is shared with the diffusion layer region of a drain of an amplification transistor 150. A contact 149 is formed in the diffusion layer region of the source of the reset transistor 140, and is connected to metal wiring 220 of the wiring layer 200.

The amplification transistor 150 and a select transistor 160 are disposed in an element isolation region 190. A gate electrode of the amplification transistor 150 is connected to the metal wiring 220 of the wiring layer 200 via a contact 159, and is connected to the source of the reset transistor 140. The diffusion layer region of a source of the amplification transistor 150 and the diffusion layer region of a drain of the select transistor 160 are shared. Furthermore, the diffusion layer region of a source of the select transistor 160 is connected to the wiring layer 200 via a contact 169. Note that the amplification transistor 150 is an example of another transistor described in the claims.

Figure 5:
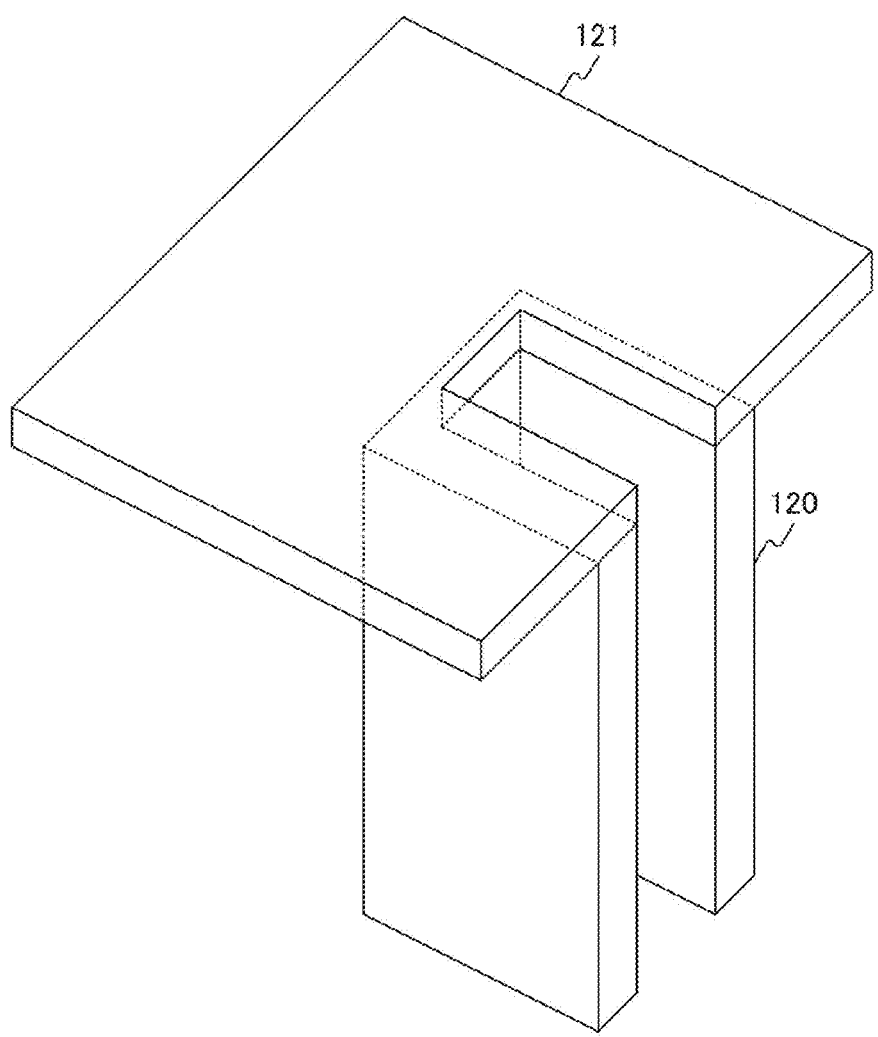
FIG. 5 is a diagram illustrating an example of an appearance of a transfer gate 120 and a contact region 121 of the transfer gate 120 according to the first embodiment of the present technology.

FIG. 5 is a diagram illustrating an example of an appearance of the transfer gate 120 and the contact region 121 of the transfer gate 120 according to the first embodiment of the present technology.

As described above, the transfer gate 120 has a U-shaped columnar shape. The U-shaped opening (dent) is continuous in the vertical direction. A charge produced in the photodiode 170 located below this opening is transmitted through this opening and transferred to above. The floating diffusion region 130 is formed in a region surrounded by the opening at above, and is shared with the diffusion layer region of the source of the reset transistor 140. Accordingly, wiring for connecting between the floating diffusion region 130 and the source of the reset transistor 140 is unnecessary.

The contact region 121 is a region where a contact for electrically connecting the transfer gate 120 to the wiring layer 200 is disposed, and is formed on a front surface of the semiconductor substrate 100. The contact region 121 is a conductor and partially contacts the transfer gate 120. Therefore, the potential of the transfer gate 120 can be controlled from the wiring layer 200 via a contact (not illustrated) disposed in the contact region 121.

Figure 6:
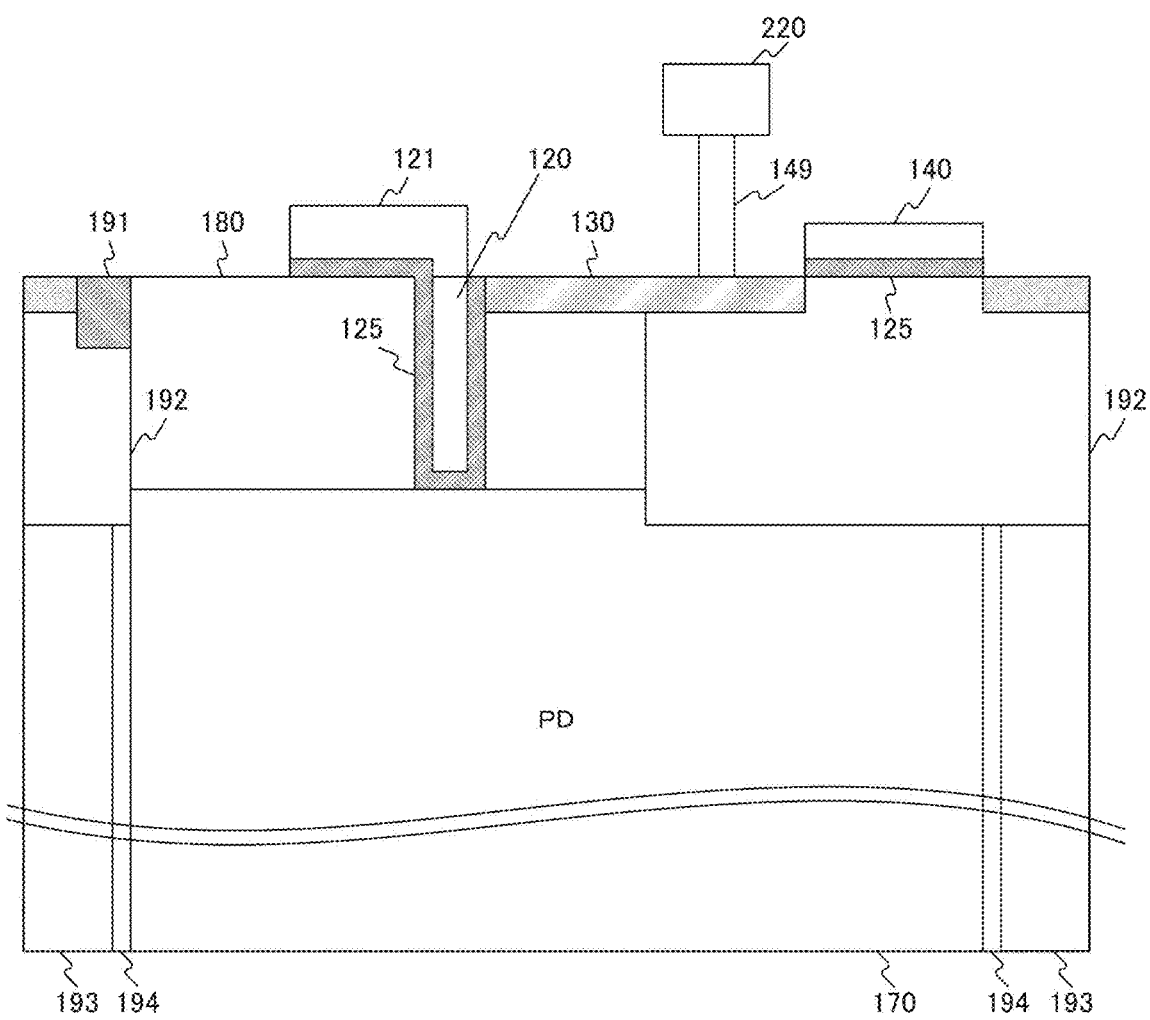
FIG. 6 is a diagram illustrating an example of a cross section of the solid-state imaging device around pixel transistors according to the first embodiment of the present technology.

FIG. 6 is a diagram illustrating an example of a cross section of the solid-state imaging device around pixel transistors according to the first embodiment of the present technology. This figure represents a cross section taken along a line A-A' in the plan view in FIG. 4.

The pixel transistors are provided on the semiconductor substrate 100. The transfer gate 120 and the contact region 121 of the transfer transistor 12 are insulated from a P-type semiconductor region 180 by a gate insulating film 125. The floating diffusion region 130 extending to a region surrounded by the U-shaped opening of the transfer gate 120 is shared with the diffusion layer region of the source of the reset transistor 140. The contact 149 is formed in the floating diffusion region 130 and is connected to the metal wiring 220 of the wiring layer 200. The connection to the gate electrode of the amplification transistor 150 is made via this metal wiring 220.

The photodiode 170 is formed below the transfer gate 120. Furthermore, a P-type well 192 is formed below the reset transistor 140. An element isolation insulating film 191 is formed in the element isolation region 190. Below the element isolation region 190, the trench 193 is formed from a back surface so as to surround the photodiode 170 in order to electrically and optically isolate adjacent pixels from each other. A plug P-type diffusion layer 194 is a P-type diffusion layer formed on a side wall of the trench 193 in order to suppress a dark current produced at an interface between the trench 193 and silicon.

[Area of Transfer Gate]

Figure 7A:
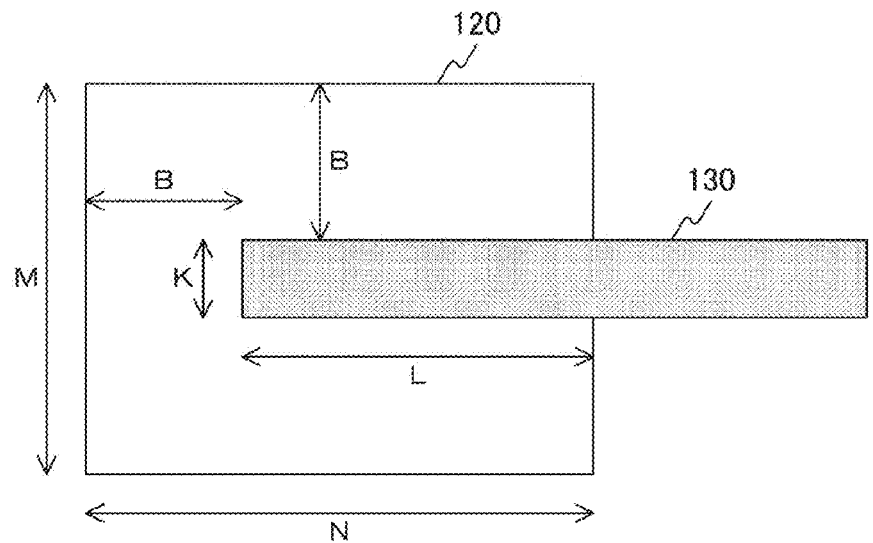
FIGS. 7A and 7B are diagrams illustrating an example of a relationship between the transfer gate 120 and a floating diffusion region 130 according to the embodiment of the present technology.
Figure 7B:
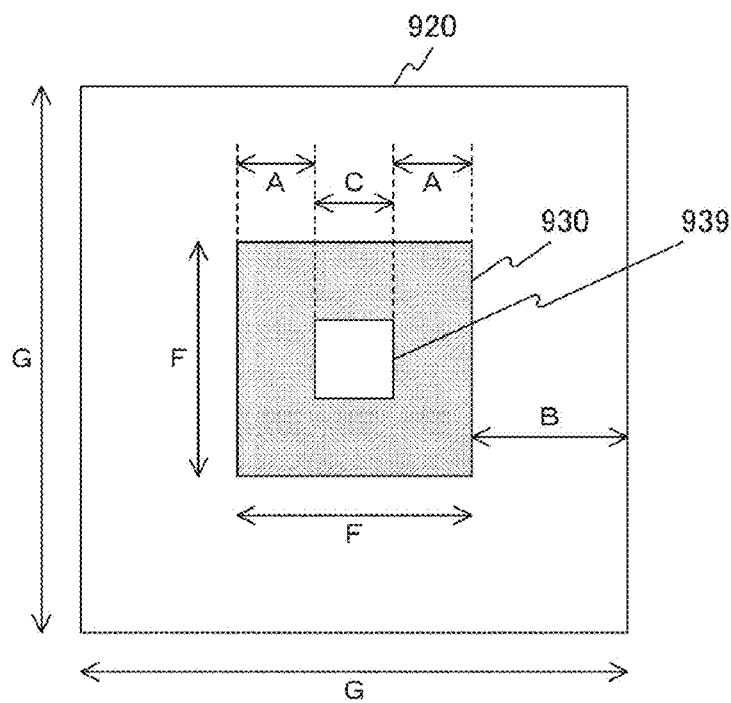

FIGS. 7A and 7B are diagrams illustrating an example of a relationship between the transfer gate 120 and the floating diffusion region 130 according to the embodiment of the present technology.

In FIG. 7A, M and N indicate the longitudinal and lateral sizes of the transfer gate 120, and L indicates a distance by which the floating diffusion region 130 extends into the U-shaped opening of the transfer gate 120. B denotes the width of the transfer gate 120, and K denotes the longitudinal size of the floating diffusion region 130. The minimum values of B and K are restricted by the machining limit values for the active area of silicon. Assuming that the minimum values of B and K are Bmin and Kmin, respectively, in the embodiment of the present technology, M cannot be more miniaturized than "Mmin=2×Bmin+Kmin".

On the other hand, FIG. 7B illustrates sizes in a case where a floating diffusion region 930 surrounded by a transfer gate 920 is assumed as a comparative example and a contact 939 is formed in this floating diffusion region 930. G indicates the longitudinal and lateral sizes of the transfer gate 920, F indicates the longitudinal and lateral sizes of the floating diffusion region 930, and C indicates the diameter of the contact 939. B denotes the width of the transfer gate 920, and A denotes a distance from an outer periphery of the contact 939 to an outer periphery of the transfer gate 920. The minimum value Amin of A is restricted by the machining limit values for the active area of silicon and the contact and dimensional variations thereof, and the alignment accuracy of the lithography step at the time of forming the contact.

In other words, in the case of the comparative example, the floating diffusion region 930 is surrounded by the transfer gate 920, and in order to electrically connect the floating diffusion region to the source diffusion layer of the reset transistor, it is necessary to provide the contact 939 within the floating diffusion region. Assuming that the minimum value of C is Cmin, the size F of the floating diffusion region 930 cannot be more miniaturized than "Fmin=2×Amin+Cmin". Furthermore, the size G of the transfer gate 920 cannot be more miniaturized than "Gmin=2×Bmin+Fmin". Accordingly, in this comparative example, there is a limit in miniaturization, and it is difficult to reduce the area.

On the other hand, in this embodiment, the floating diffusion region 130 is extended in a region surrounded by the U-shaped opening of the transfer gate 120, and is formed integrally with the diffusion layer region of the source of the reset transistor 140. Therefore, it is not necessary to interpose the wiring layer 200 between the floating diffusion region 130 and the source of the reset transistor 140 for connection therebetween, and it is not necessary to provide a contact in the floating diffusion region 130 surrounded by the transfer gate 120. In general, Kmin≤Cmin is satisfied, such that Kmin<Fmin is satisfied, and at the same time, Mmin<Gmin is also satisfied. For reasons described thus far, in the embodiment of the present technology, it is easier to make the size K of the floating diffusion region 130 and M of the transfer gate 120 small as compared with a case where the floating diffusion region is surrounded by the transfer gate.

[Method of Manufacturing Solid-State Imaging Device]

Next, an example of a method of manufacturing the solid-state imaging device according to the embodiment of the present technology will be described. When the solid-state imaging device is manufactured, first, the photodiode 170 and the element isolation region 190 are formed by implanting impurity ions into the semiconductor substrate 100 from the front surface side of the semiconductor substrate 100. Then, after forming members such as the pixel transistors on the front surface side of this semiconductor substrate 100, the wiring layer 200 is formed so as to coat front surfaces of the formed members. Then, the support substrate 290 is attached to the front surface of the wiring layer 200. Thereafter, a film thinning process for polishing the back surface side of the semiconductor substrate 100 is carried out. Then, respective members such as the insulating film 101, the light shielding film 340, the planarization film 330, the color filter 320, and the microlens 310 are sequentially provided on the back surface side of the semiconductor substrate 100. Thus, the solid-state imaging device is manufactured. The following description focuses on a manufacturing course for the transfer gate 120, which is a main part of the embodiment of the present technology, with reference to the drawings.

Figure 8A:
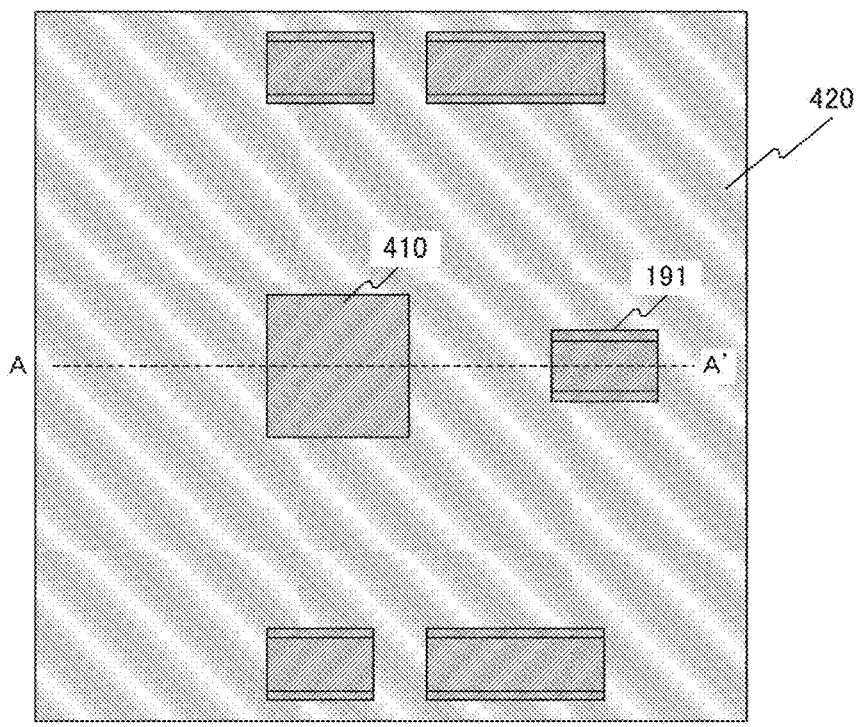
FIGS. 8A and 8B are diagrams illustrating a first step of an example of a method of manufacturing the solid-state imaging device according to the first embodiment of the present technology.
Figure 8B:
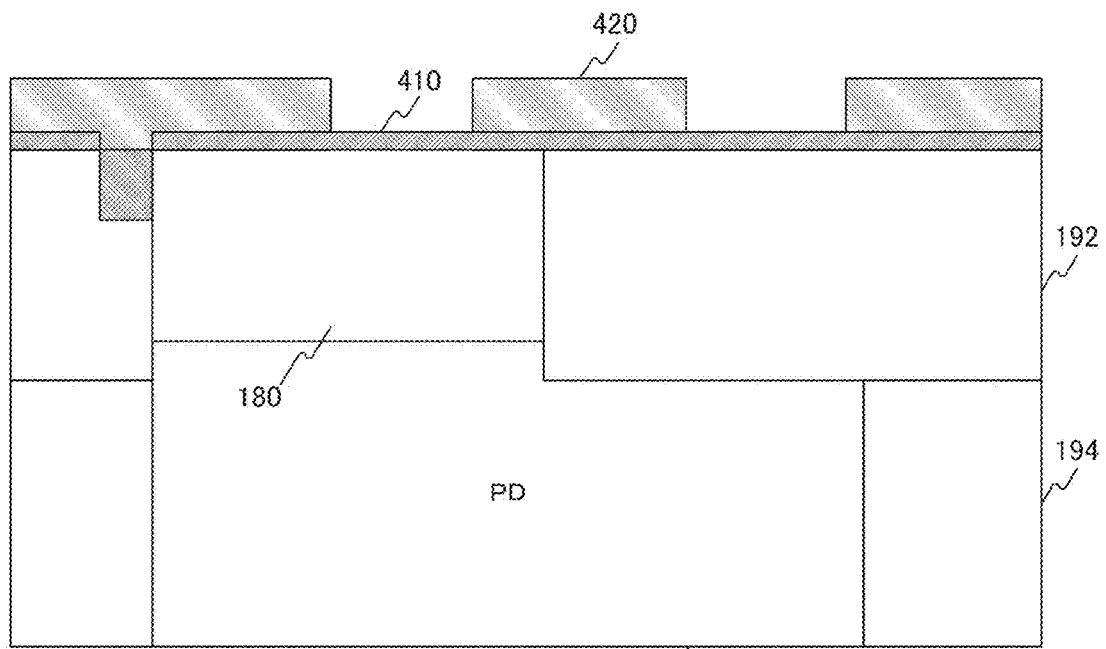

FIGS. 8A and 8B are diagrams illustrating a first step of an example of the method of manufacturing the solid-state imaging device according to a first embodiment of the present technology. Here, a state after the photodiode 170 is formed in the P-type semiconductor region 180, and the plug P-type diffusion layer 194 and the P-type well 192 are formed is illustrated. The element isolation insulating film 191 is formed in the element isolation region 190.

An oxide film 410 is formed on a front surface of the P-type semiconductor region 180, and a SiN film 420 used as a mask material is deposited. Thereafter, the SiN film 420 in the gate region is patterned to expose the oxide film 410.

Figure 9A:
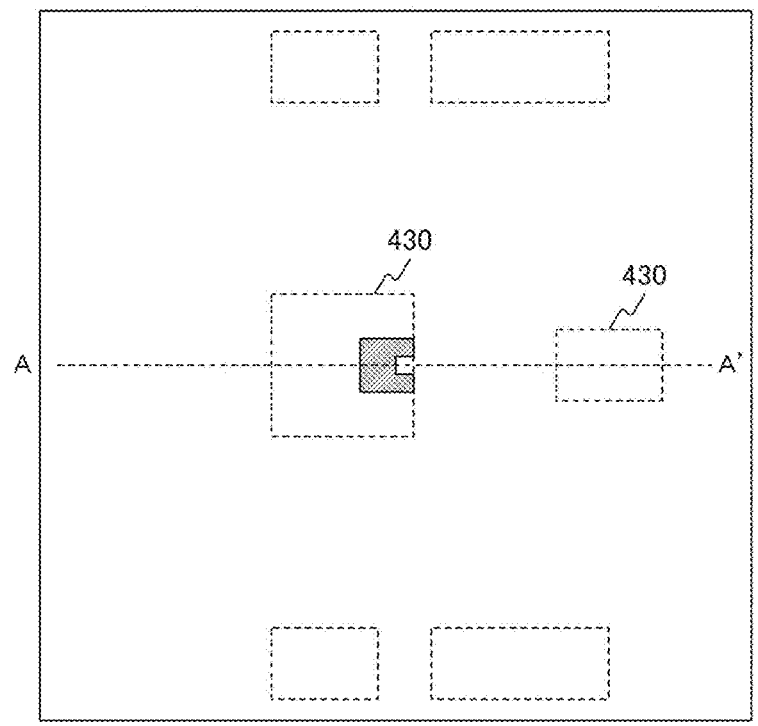
FIGS. 9A and 9B are diagrams illustrating a second step of an example of the method of manufacturing the solid-state imaging device according to the first embodiment of the present technology.
Figure 9B:
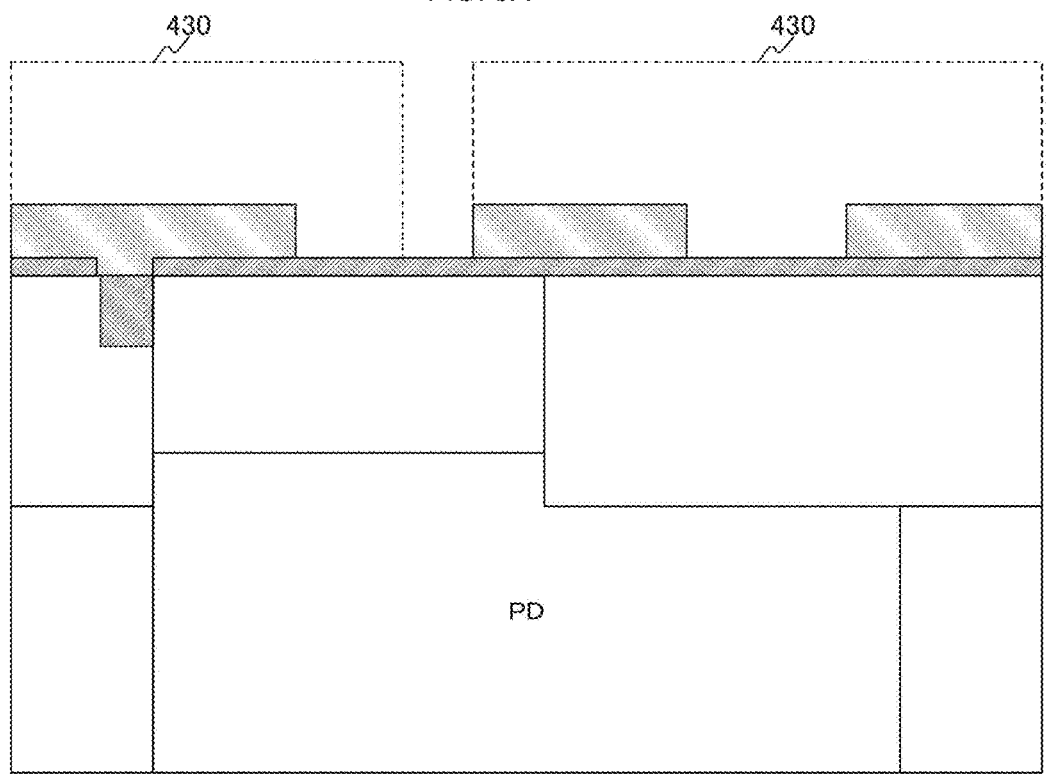

FIGS. 9A and 9B are diagrams illustrating a second step of an example of the method of manufacturing the solid-state imaging device according to the first embodiment of the present technology. Here, after depositing a resist 430, a region corresponding to the opening of the transfer gate 120 is patterned.

Figure 10A:
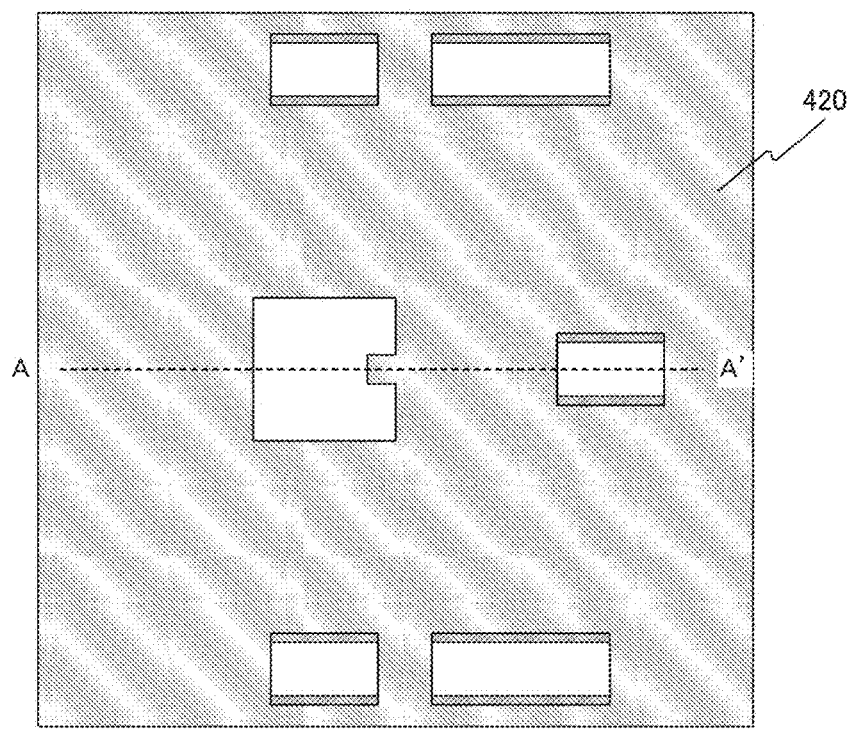
FIGS. 10A and 10B are diagrams illustrating a third step of an example of the method of manufacturing the solid-state imaging device according to the first embodiment of the present technology.
Figure 10B:
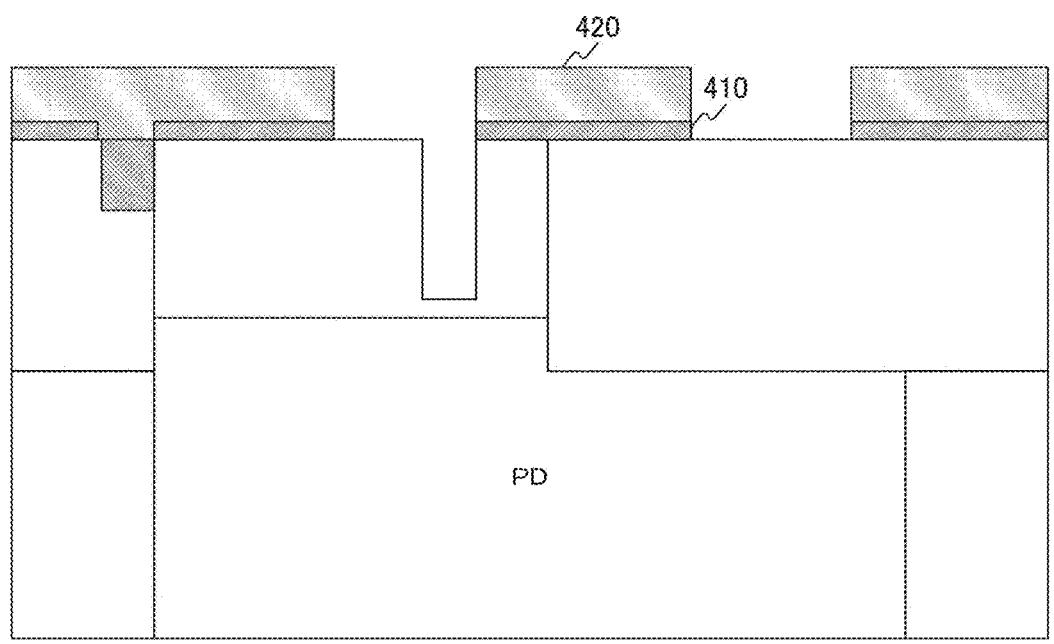

FIGS. 10A and 10B are diagrams illustrating a third step of an example of the method of manufacturing the solid-state imaging device according to the first embodiment of the present technology. Here, the oxide film 410 is etched using the resist 430 as a mask; next, after the silicon of the P-type semiconductor region 180 is etched to a desired depth, the resist 430 is peeled. With this step, the shape of the transfer gate 120 is formed. Thereafter, using the SiN film 420 as a mask, the oxide film 410 is removed.

Figure 11A:
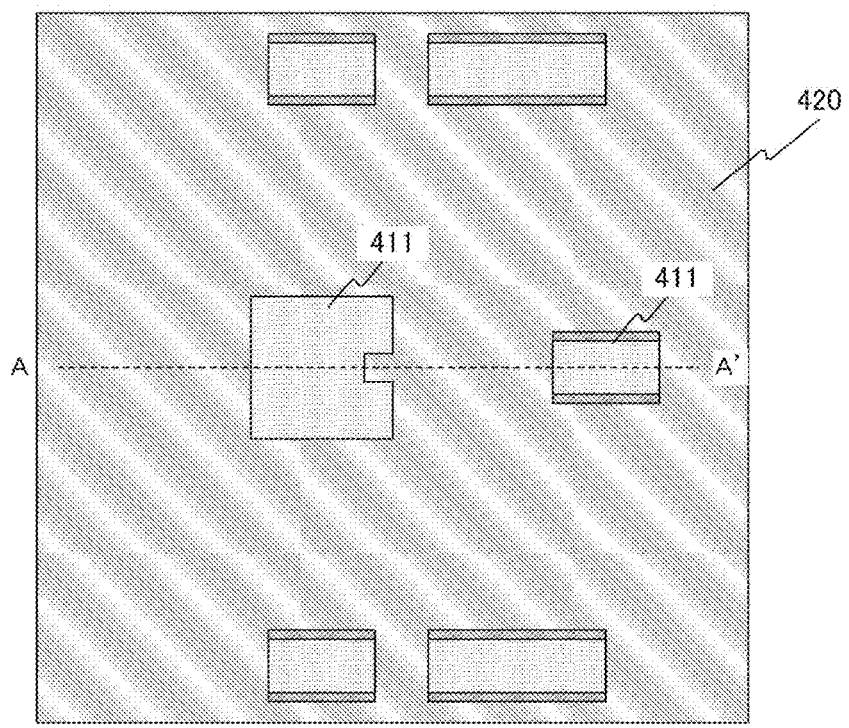
FIGS. 11A and 11B are diagrams illustrating a fourth step of an example of the method of manufacturing the solid-state imaging device according to the first embodiment of the present technology.
Figure 11B:
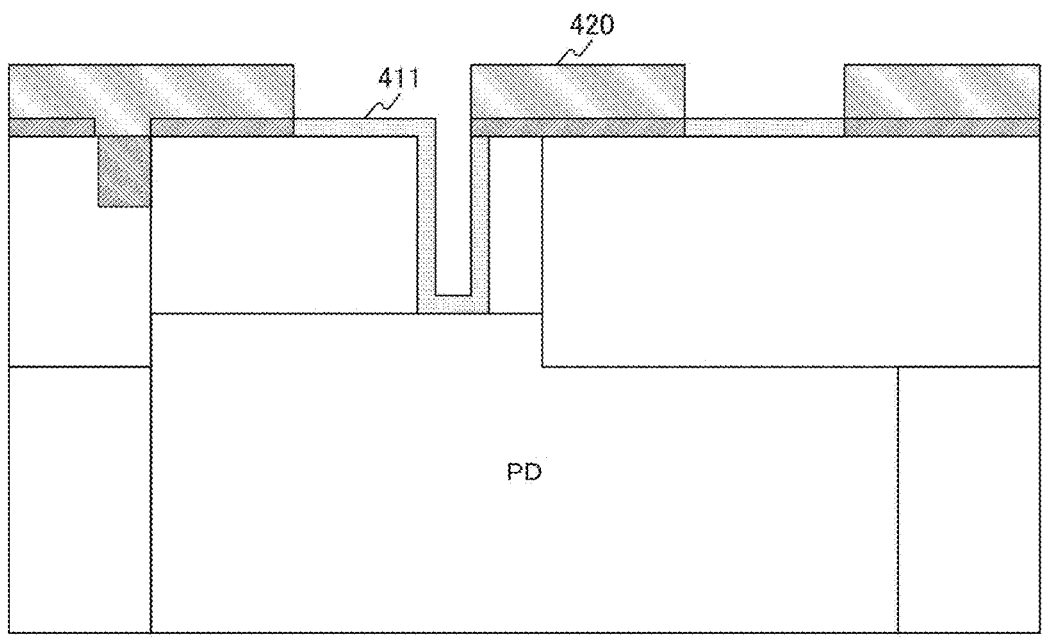

FIGS. 11A and 11B are diagrams illustrating a fourth step of an example of the method of manufacturing the solid-state imaging device according to the first embodiment of the present technology. Here, silicon on the front surface of the P-type semiconductor region 180 is thermally oxidized to form a gate insulating film 411.

Figure 12A:
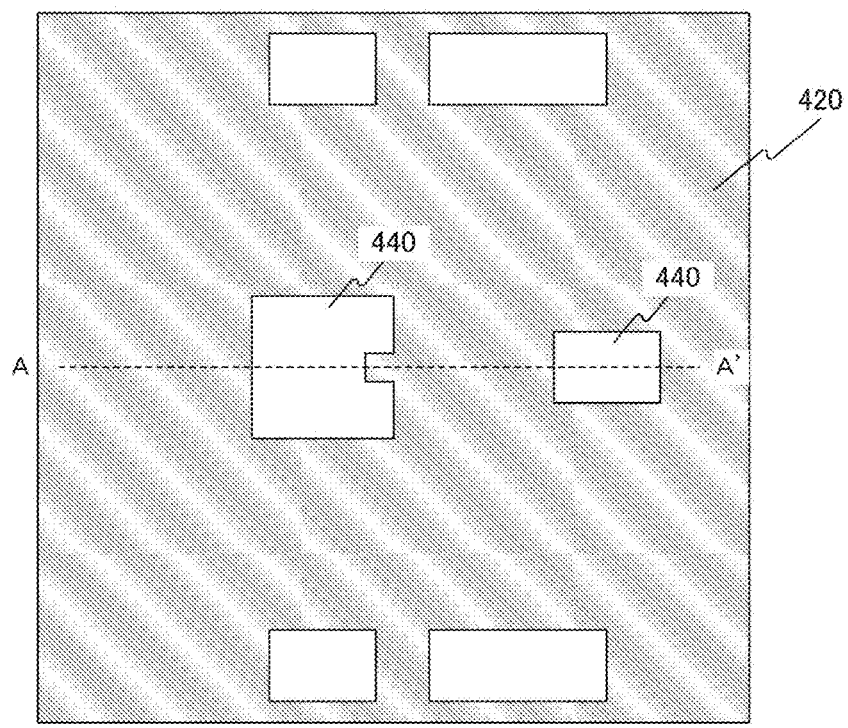
FIGS. 12A and 12B are diagrams illustrating a fifth step of an example of the method of manufacturing the solid-state imaging device according to the first embodiment of the present technology.
Figure 12B:
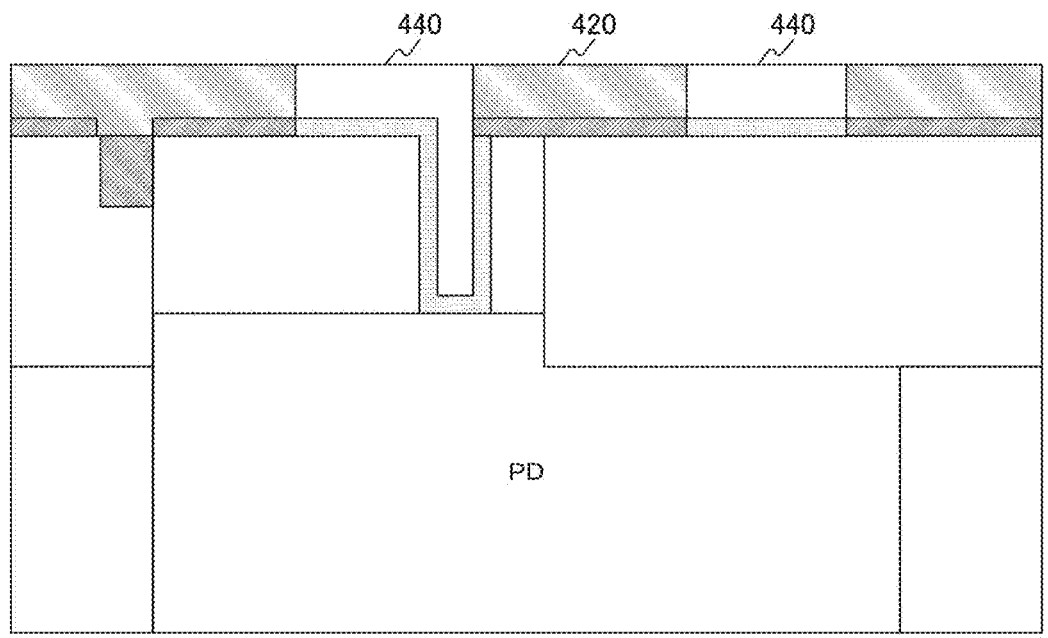

FIGS. 12A and 12B are diagrams illustrating a fifth step of an example of the method of manufacturing the solid-state imaging device according to the first embodiment of the present technology. Here, for example, a gate electrode material including polycrystalline silicon (polysilicon) 440 is deposited, and etch back is performed until the SiN film 420 is exposed. Note that, in this step, it is also possible to perform forming using chemical mechanical polishing (CMP) technology.

Figure 13A:
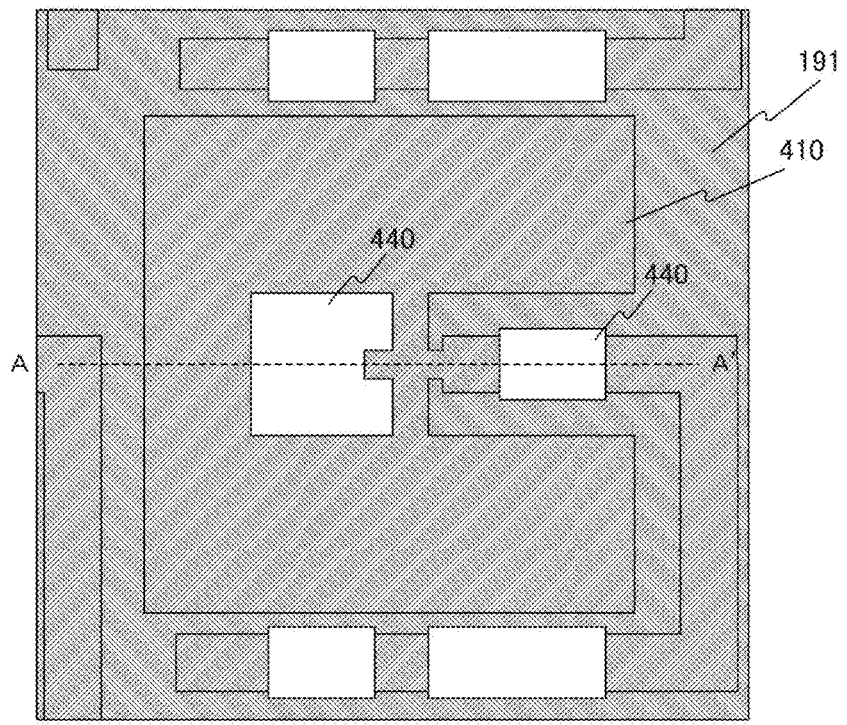
FIGS. 13A and 13B are diagrams illustrating a sixth step of an example of the method of manufacturing the solid-state imaging device according to the first embodiment of the present technology.
Figure 13B:
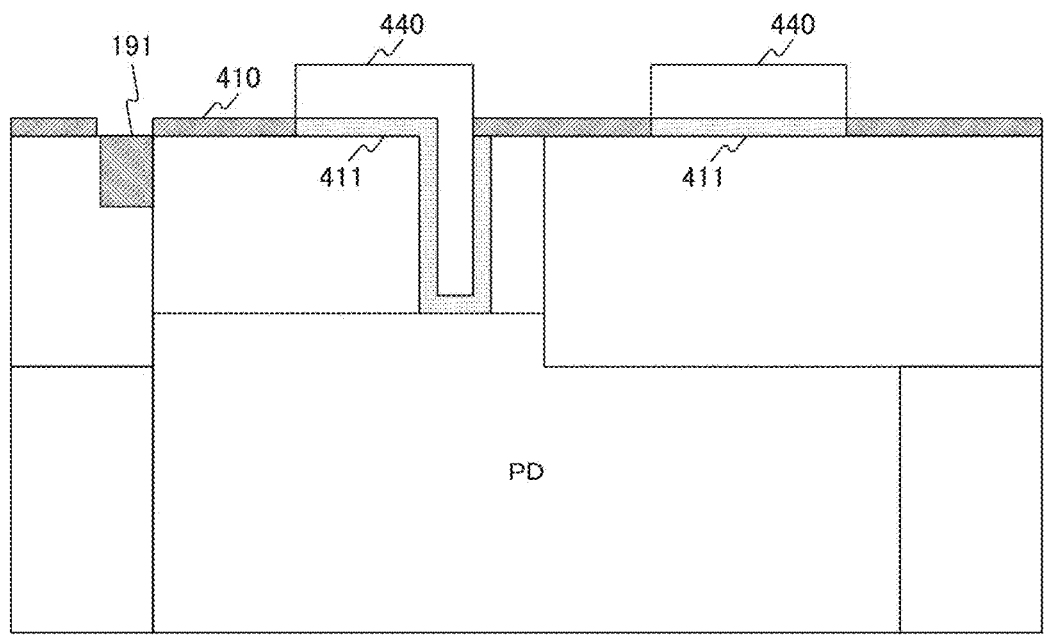

FIGS. 13A and 13B are diagrams illustrating a sixth step of an example of the method of manufacturing the solid-state imaging device according to the first embodiment of the present technology. Here, the SiN film 420 is peeled by wet etching. With this step, the oxide film 410 formed in the first step and the polycrystalline silicon 440 deposited in the fifth step are exposed.

Figure 14A:
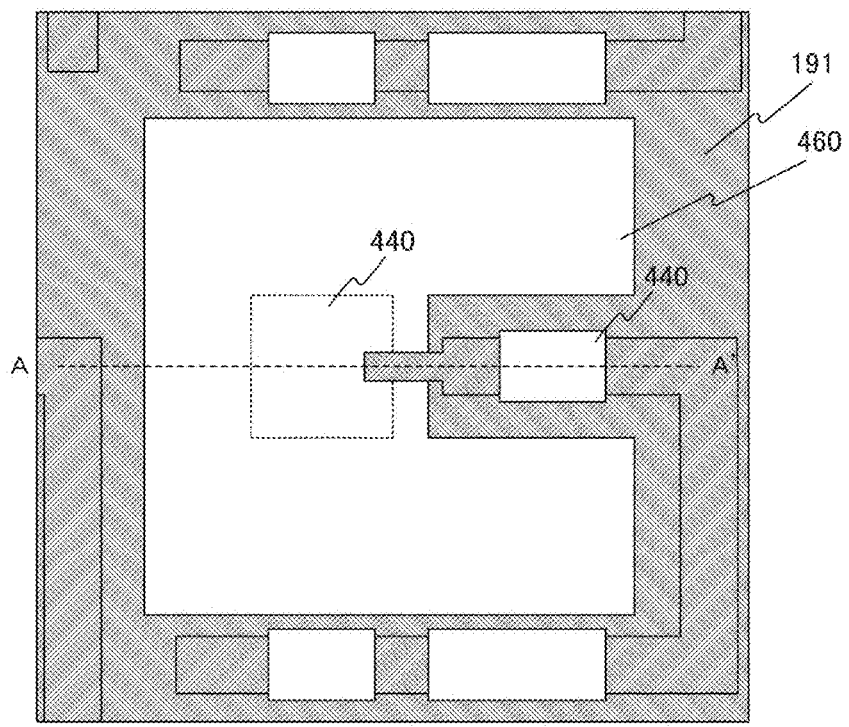
FIGS. 14A and 14B are diagrams illustrating a seventh step of an example of the method of manufacturing the solid-state imaging device according to the first embodiment of the present technology.
Figure 14B:
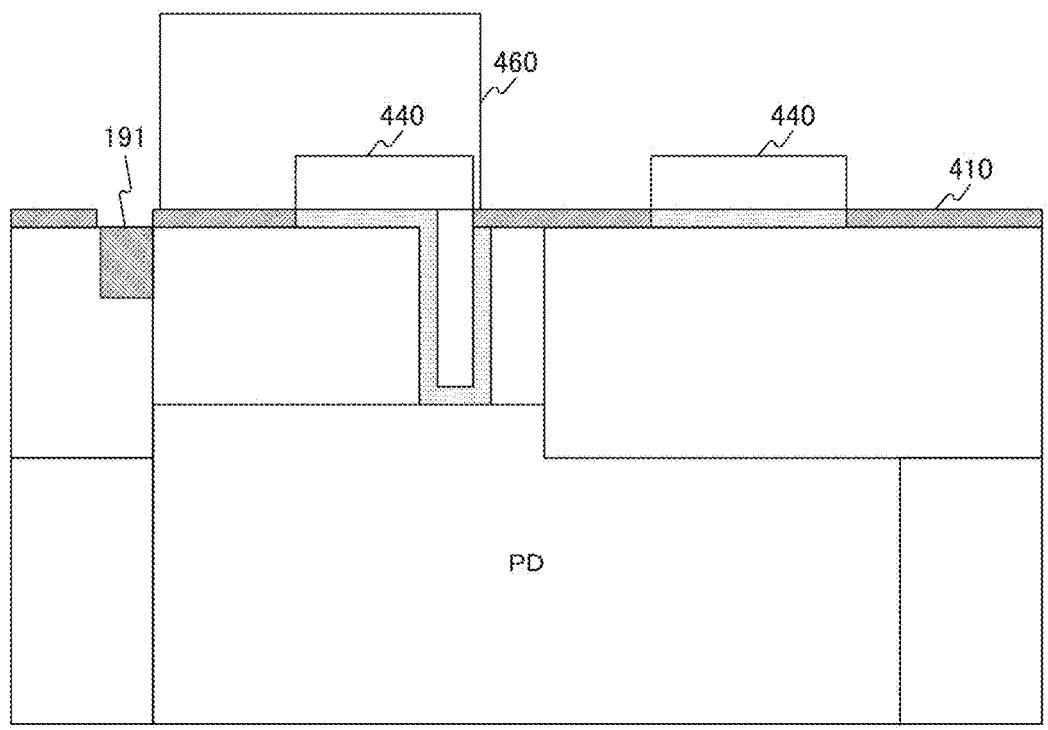

FIGS. 14A and 14B are diagrams illustrating a seventh step of an example of the method of manufacturing the solid-state imaging device according to the first embodiment of the present technology. Here, after a resist 460 is deposited again, patterning is performed on a region where the floating diffusion region 130 and the N-type diffusion layer of the reset transistor 140 are to be formed.

Figure 15A:
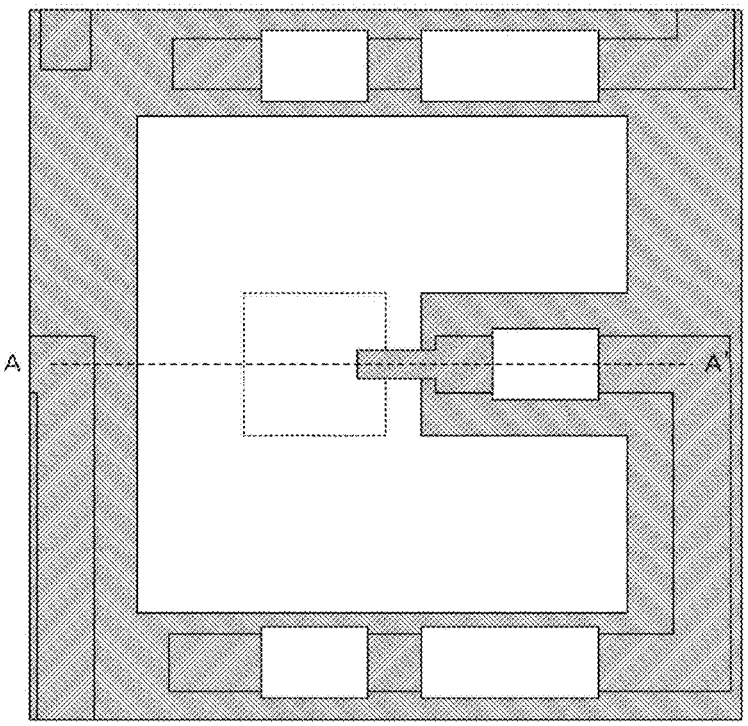
FIGS. 15A and 15B are diagrams illustrating an eighth step of an example of the method of manufacturing the solid-state imaging device according to the first embodiment of the present technology.
Figure 15B:
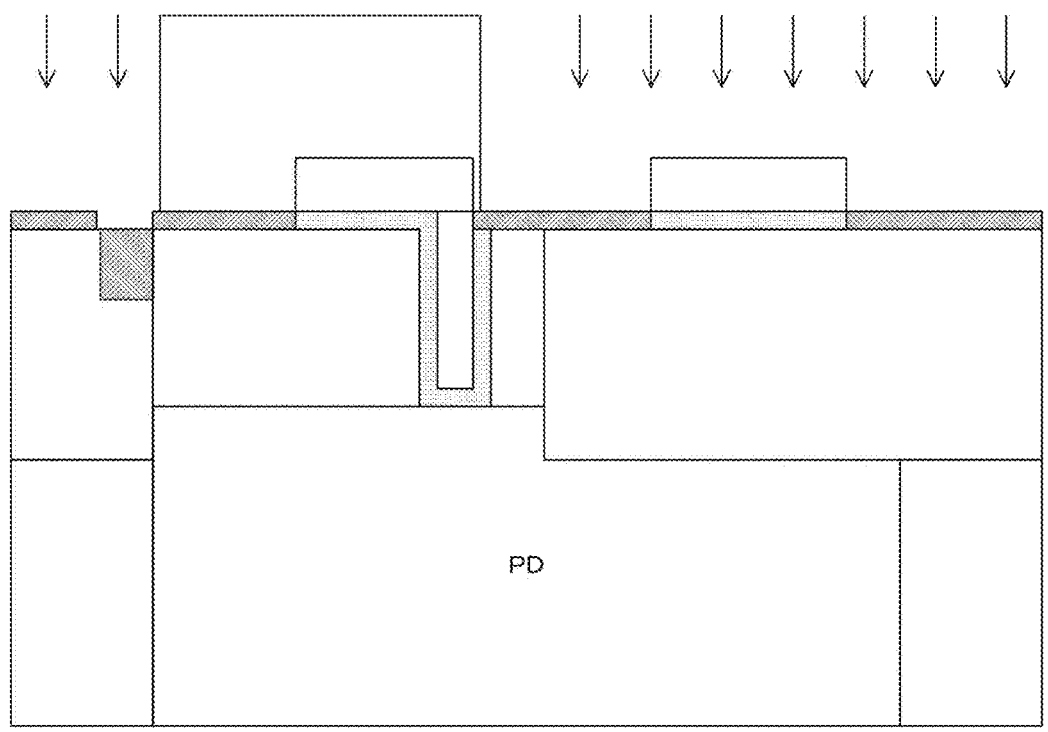

FIGS. 15A and 15B are diagrams illustrating an eighth step of an example of the method of manufacturing the solid-state imaging device according to the first embodiment of the present technology. Here, using the resist 460 as a mask, ion implantation of an N-type impurity is performed into an opening portion of the resist 460.

Figure 16A:
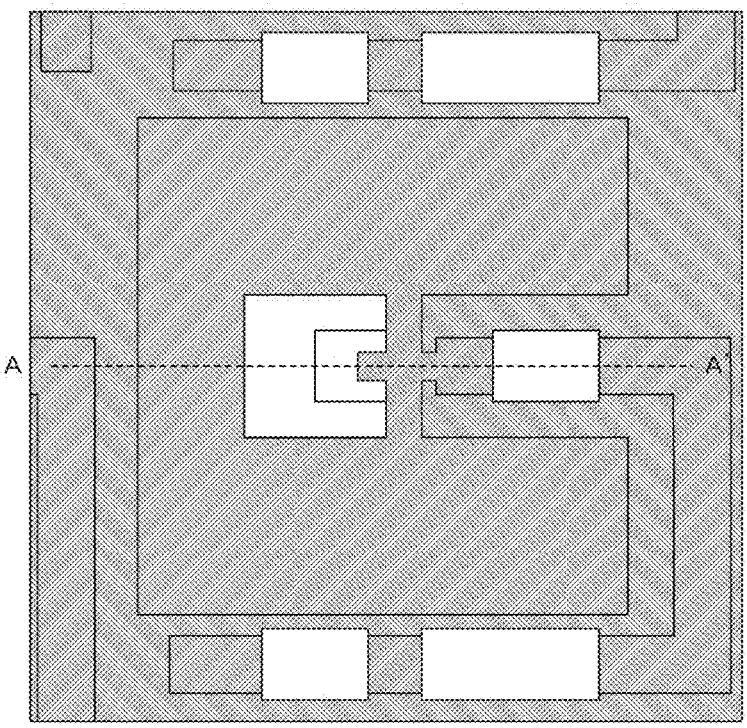
FIGS. 16A and 16B are diagrams illustrating a ninth step of an example of the method of manufacturing the solid-state imaging device according to the first embodiment of the present technology.
Figure 16B:
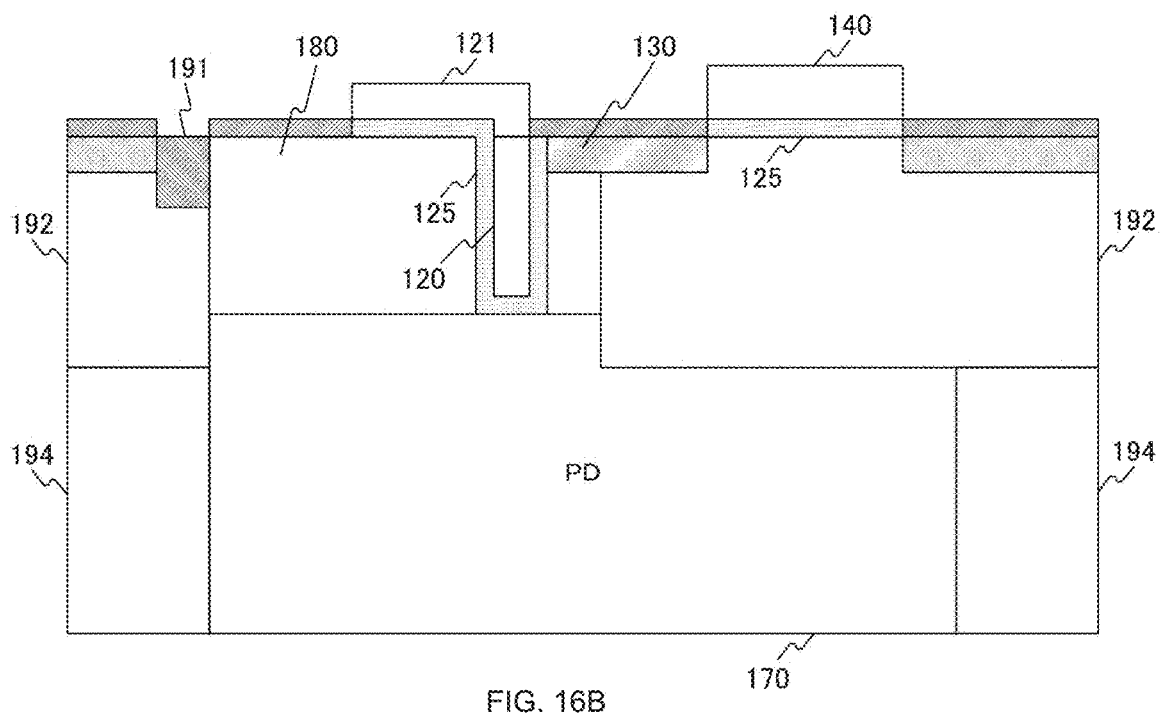

FIGS. 16A and 16B are diagrams illustrating a ninth step of an example of the method of manufacturing the solid-state imaging device according to the first embodiment of the present technology. After peeling the resist 460, heat treatment is conducted. With this step, a region that was the opening portion of the resist 460 becomes the N-type diffusion layer. In other words, the floating diffusion region 130 and the diffusion layer of the source of the reset transistor 140 are integrally formed.

As described above, in the first embodiment of the present technology, the transfer gate 120 is formed in a U-shaped column shape, and the floating diffusion region 130 is formed extending in a region surrounded by the opening of the U-shaped column shape. This floating diffusion region 130 is shared with the diffusion layer region of the source of the reset transistor 140, and is formed integrally. Therefore, it is not necessary to interpose the wiring layer 200 between the floating diffusion region 130 and the source of the reset transistor 140 for connection therebetween, and it is not necessary to provide a contact in the floating diffusion region 130 surrounded by the transfer gate 120. Consequently, the sizes of the floating diffusion region 130 and the transfer gate 120 can be reduced.

2. Second Embodiment

In the above-described first embodiment, the connection between the floating diffusion region 130 and the gate electrode of the amplification transistor 150 is made via the wiring layer 200. On the other hand, a second embodiment to be described here differs from the first embodiment described above in that a floating diffusion region 130 and a gate electrode of an amplification transistor 150 are connected using a shared contact. Note that the overall configuration and the circuit configuration as the solid-state imaging device are similar to those in the above-described first embodiment, and thus a detailed description thereof will be omitted.

[Structure of Solid-State Imaging Device]

Figure 17:
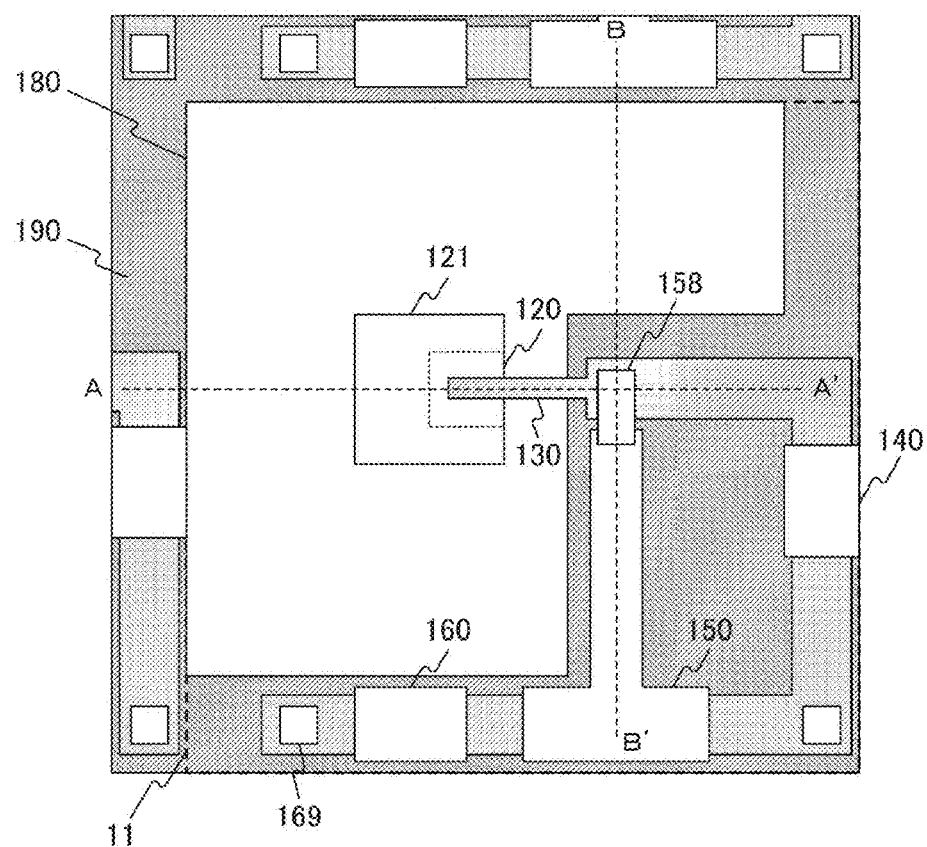
FIG. 17 is an example of a plan view of a semiconductor substrate 100 of a pixel 11 according to a second embodiment of the present technology.

FIG. 17 is an example of a plan view of a semiconductor substrate 100 of a pixel 11 according to the second embodiment of the present technology.

In this example, a reset transistor 140 is formed in an element isolation region. However, there is no inconsistency with the above-described first embodiment in that a transfer gate 120 is formed in a U-shaped column shape and the floating diffusion region 130 is shared with the diffusion layer region of a source of the reset transistor 140.

Meanwhile, the gate electrode of the amplification transistor 150 has a shape extending to the diffusion layer region of the source of the reset transistor 140. Then, the diffusion layer region of the source of the reset transistor 140 and the gate electrode of the amplification transistor 150 are electrically short-circuited via a shared contact 158.

Figure 18:
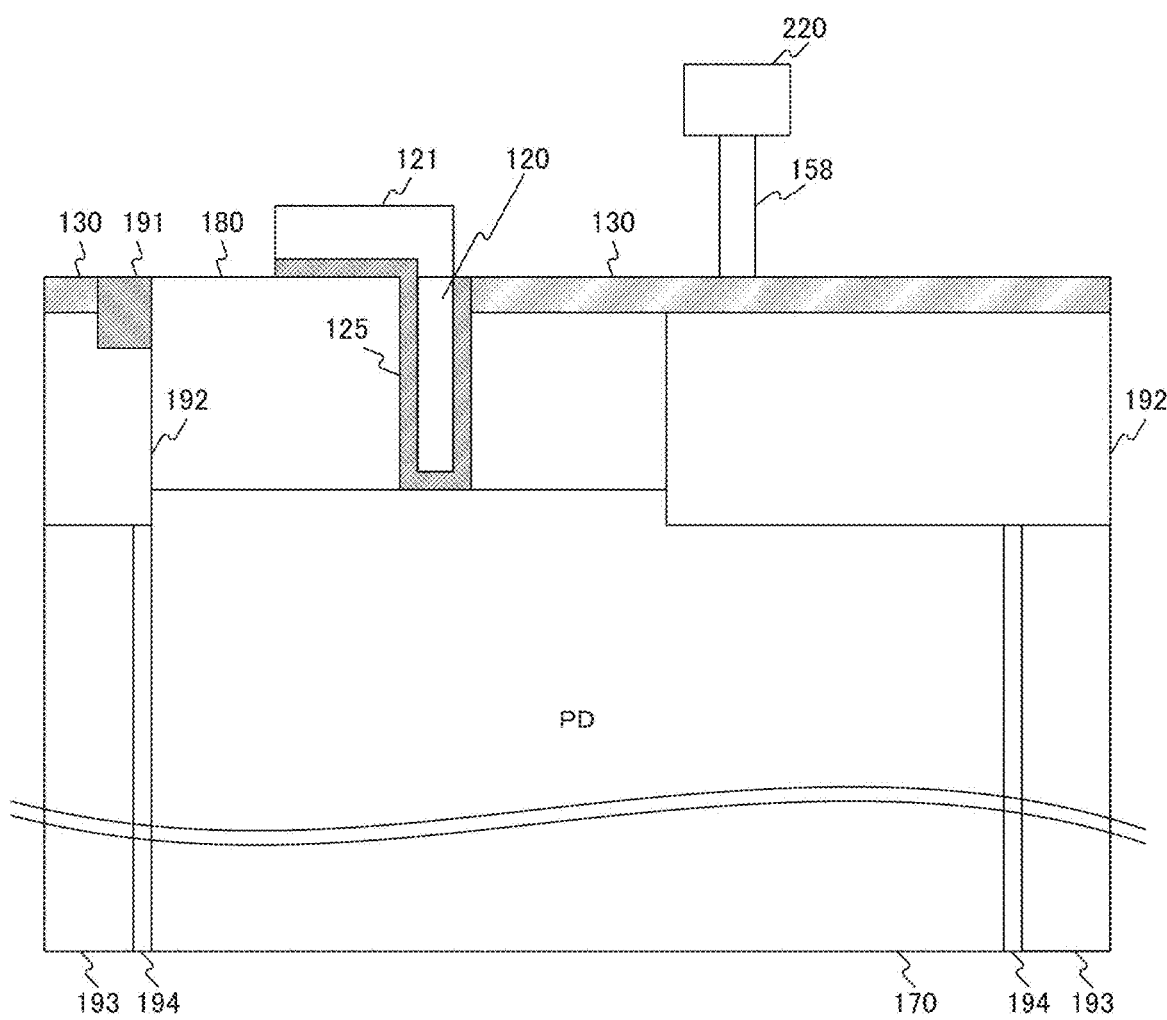
FIG. 18 is a diagram illustrating an example of a cross section of a solid-state imaging device around pixel transistors according to the second embodiment of the present technology.

FIG. 18 is a diagram illustrating an example of a cross section of the solid-state imaging device around pixel transistors according to the second embodiment of the present technology. This figure represents a cross section taken along a line A-A' in the plan view in FIG. 17.

In this second embodiment, since the reset transistor 140 is disposed in the element isolation region, the reset transistor 140 does not appear in this cross section taken along the line A-A'. In the floating diffusion region 130 and the diffusion layer region of the source of the reset transistor 140, the shared contact 158 is formed and connected to metal wiring 220 of a wiring layer 200.

Figure 19:
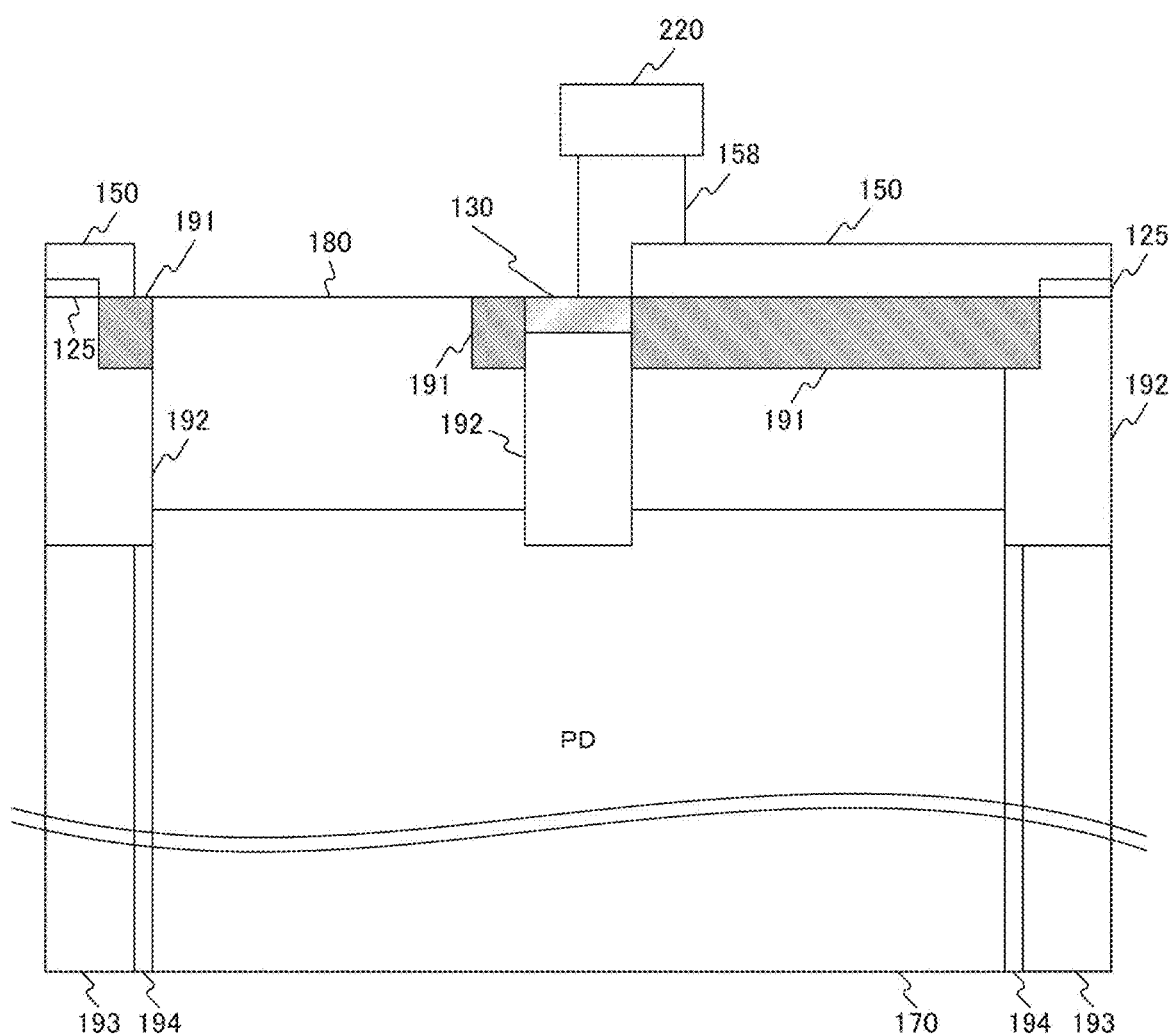
FIG. 19 is a diagram illustrating an example of another cross section of the solid-state imaging device around the pixel transistors according to the second embodiment of the present technology.

FIG. 19 is a diagram illustrating an example of another cross section of the solid-state imaging device around the pixel transistors according to the second embodiment of the present technology. This figure represents a cross section taken along a line B-B' in the plan view in FIG. 17.

In this second embodiment, the gate electrode of the amplification transistor 150 extends to the diffusion layer region of the source of the reset transistor 140. Then, the connection to the gate electrode of the amplification transistor 150 is made through the floating diffusion region 130 and the shared contact 158 formed in the diffusion layer region of the source of the reset transistor 140, and is electrically short-circuited.

As described above, in the second embodiment of the present technology, the gate electrode of the amplification transistor 150 is electrically short-circuited via the floating diffusion region 130 and the shared contact 158 formed in the diffusion layer region of the source of the reset transistor 140. Consequently, the contact of the floating diffusion region 130 and the contact of the gate electrode of the amplification transistor 150 are shared, and the number of contacts with the wiring layer 200 can be decreased.

3. Third Embodiment

In the first embodiment described above, a structure in which pixel transistors are independent for each pixel is assumed. On the other hand, a third embodiment to be described here differs from the first embodiment described above in that some of the pixel transistors are shared between pixels. Note that the overall configuration and the circuit configuration as the solid-state imaging device are similar to those in the above-described first embodiment, and thus a detailed description thereof will be omitted.

[Structure of Solid-State Imaging Device]

Figure 20:
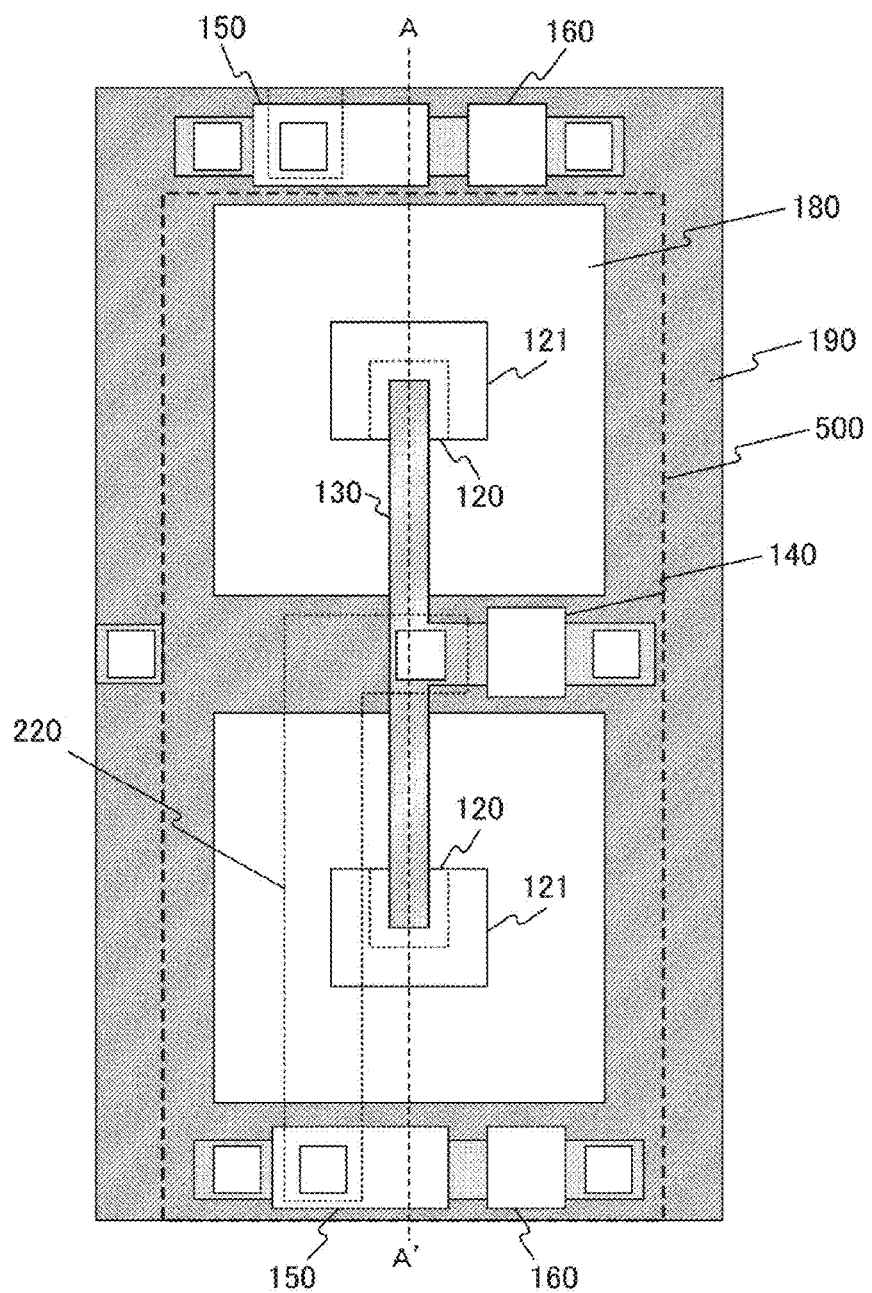
FIG. 20 is an example of a plan view of a semiconductor substrate 100 of a pixel 11 according to a third embodiment of the present technology.

FIG. 20 is an example of a plan view of a semiconductor substrate 100 of a pixel 11 according to the third embodiment of the present technology.

In this example, a structure 500 having a 2×1 pixel arrangement is employed, in which a reset transistor 140 is formed in an element isolation region at the center between two pixels on upper and lower sides and is shared. Furthermore, amplification transistors 150 and select transistors 160 are disposed in element isolation regions on upper and lower sides on an outer periphery of the two pixels, and are shared.

However, there is no inconsistency with the above-described first embodiment in that a transfer gate 120 is formed in a U-shaped column shape and a floating diffusion region 130 is shared with a diffusion layer region of a source of the reset transistor 140.

Figure 21:
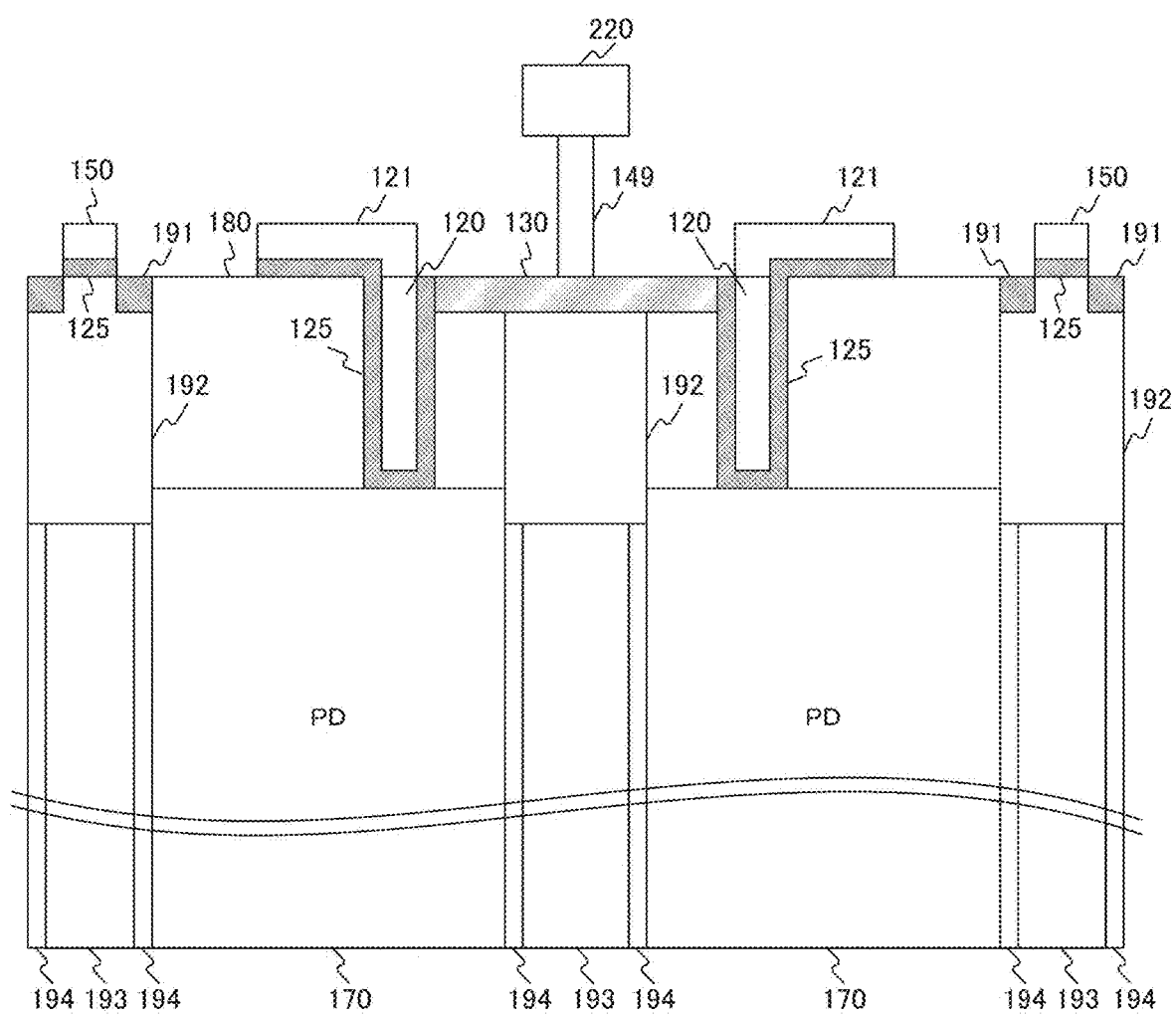
FIG. 21 is a diagram illustrating an example of a cross section of a solid-state imaging device around pixel transistors according to the third embodiment of the present technology.

FIG. 21 is a diagram illustrating an example of a cross section of a solid-state imaging device around pixel transistors according to the third embodiment of the present technology. This figure represents a cross section taken along a line A-A' in the plan view in FIG. 20.

The floating diffusion region 130 extends to a region surrounded by U-shaped openings of two transfer gates 120 in two pixels on upper and lower sides, and is shared with the diffusion layer region of the source of the reset transistor 140. A contact 149 is formed in the floating diffusion region 130 and is connected to metal wiring 220 of a wiring layer 200. The connection to the gate electrode of the amplification transistor 150 is made via this metal wiring 220.

As described above, in the third embodiment of the present technology, the reset transistor 140 is shared between two pixels on upper and lower sides. Also in this case, it is not necessary to interpose the wiring layer 200 between the floating diffusion region 130 and the source of the reset transistor 140 for connection therebetween, such that the sizes of the floating diffusion region 130 and the transfer gate 120 can be reduced.

4. Fourth Embodiment

In the above-described second embodiment, the shared contact is used assuming a structure in which pixel transistors are independent for each pixel. On the other hand, a fourth embodiment to be described here differs from the second embodiment described above in that a shared contact is used while some of pixel transistors are shared between pixels. Note that the overall configuration and the circuit configuration as the solid-state imaging device are similar to those in the above-described first embodiment, and thus a detailed description thereof will be omitted.

[Structure of Solid-State Imaging Device]

Figure 22:
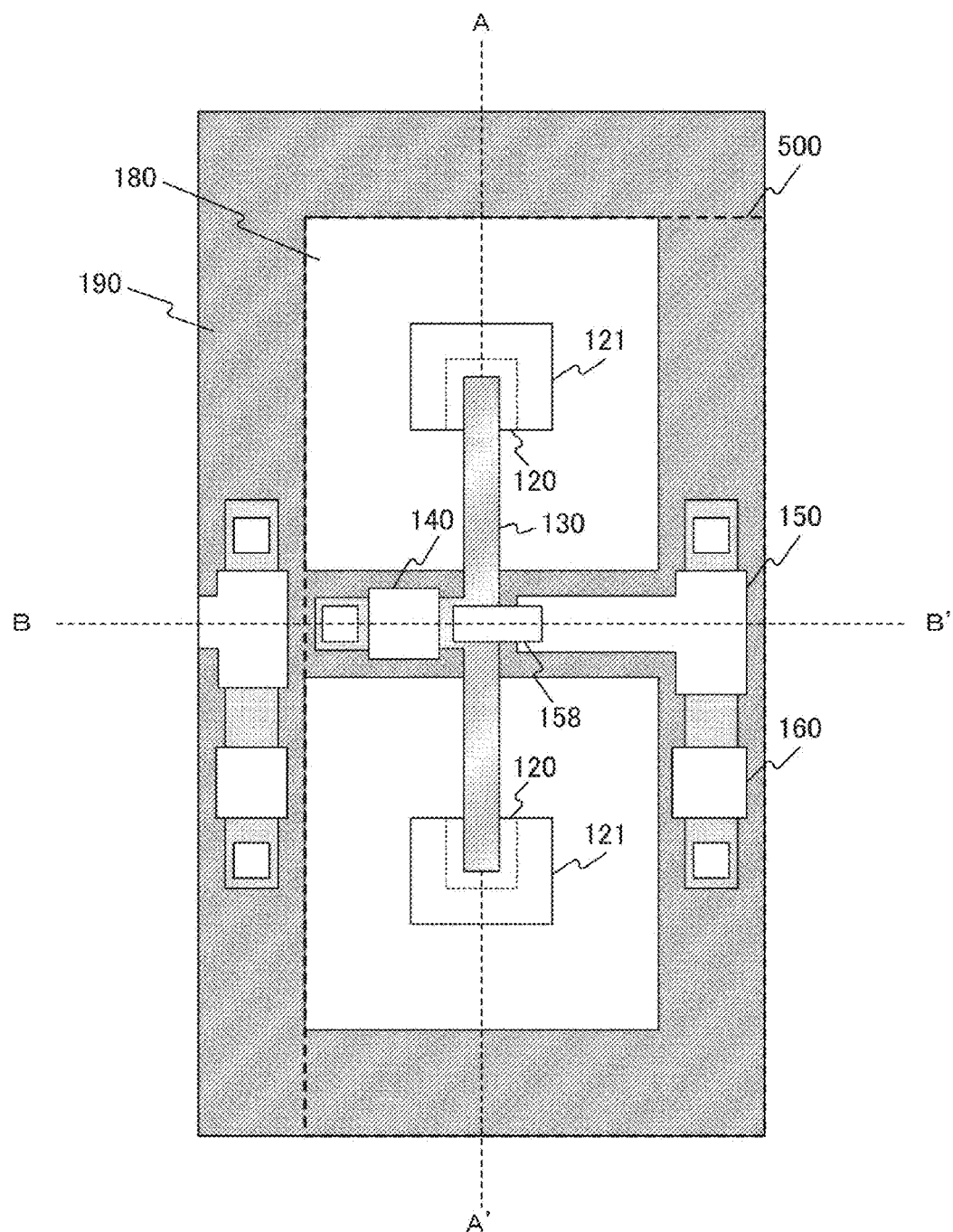
FIG. 22 is an example of a plan view of a semiconductor substrate 100 of a pixel 11 according to a fourth embodiment of the present technology.

FIG. 22 is an example of a plan view of a semiconductor substrate 100 of a pixel 11 according to the fourth embodiment of the present technology.

In this example, a structure 500 having a 2×1 pixel arrangement is employed, in which a reset transistor 140 is formed in an element isolation region at the center between two pixels on upper and lower sides and is shared. Furthermore, amplification transistors 150 and select transistors 160 are disposed in element isolation regions on left and right sides on an outer periphery of the two pixels, and are shared. However, there is no inconsistency with the above-described first embodiment in that a transfer gate 120 is formed in a U-shaped column shape and a floating diffusion region 130 is shared with a diffusion layer region of a source of the reset transistor 140.

Meanwhile, a gate electrode of the amplification transistor 150 has a shape extending to the diffusion layer region of the source of the reset transistor 140. Then, the diffusion layer region of the source of the reset transistor 140 and the gate electrode of the amplification transistor 150 are electrically short-circuited via a shared contact 158.

Figure 23:
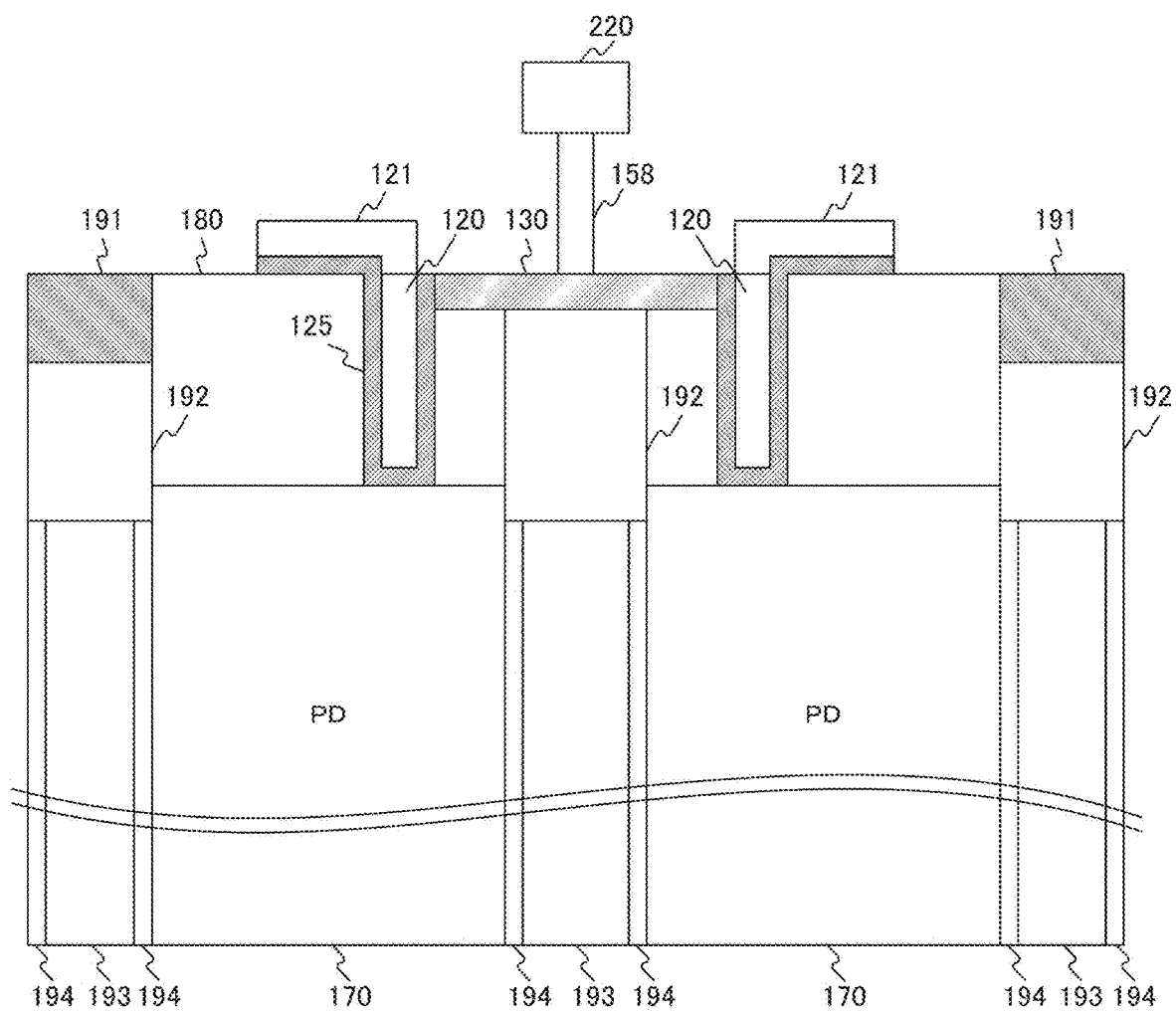
FIG. 23 is a diagram illustrating an example of a cross section of a solid-state imaging device around pixel transistors according to the fourth embodiment of the present technology.

FIG. 23 is a diagram illustrating an example of a cross section of a solid-state imaging device around pixel transistors according to the fourth embodiment of the present technology. This figure represents a cross section taken along a line A-A' in the plan view in FIG. 22.

The floating diffusion region 130 extends to a region surrounded by U-shaped openings of two transfer gates 120 in two pixels on upper and lower sides, and is shared with the diffusion layer region of the source of the reset transistor 140. The shared contact 158 is formed in the floating diffusion region 130 and is connected to metal wiring 220 of a wiring layer 200.

Figure 24:
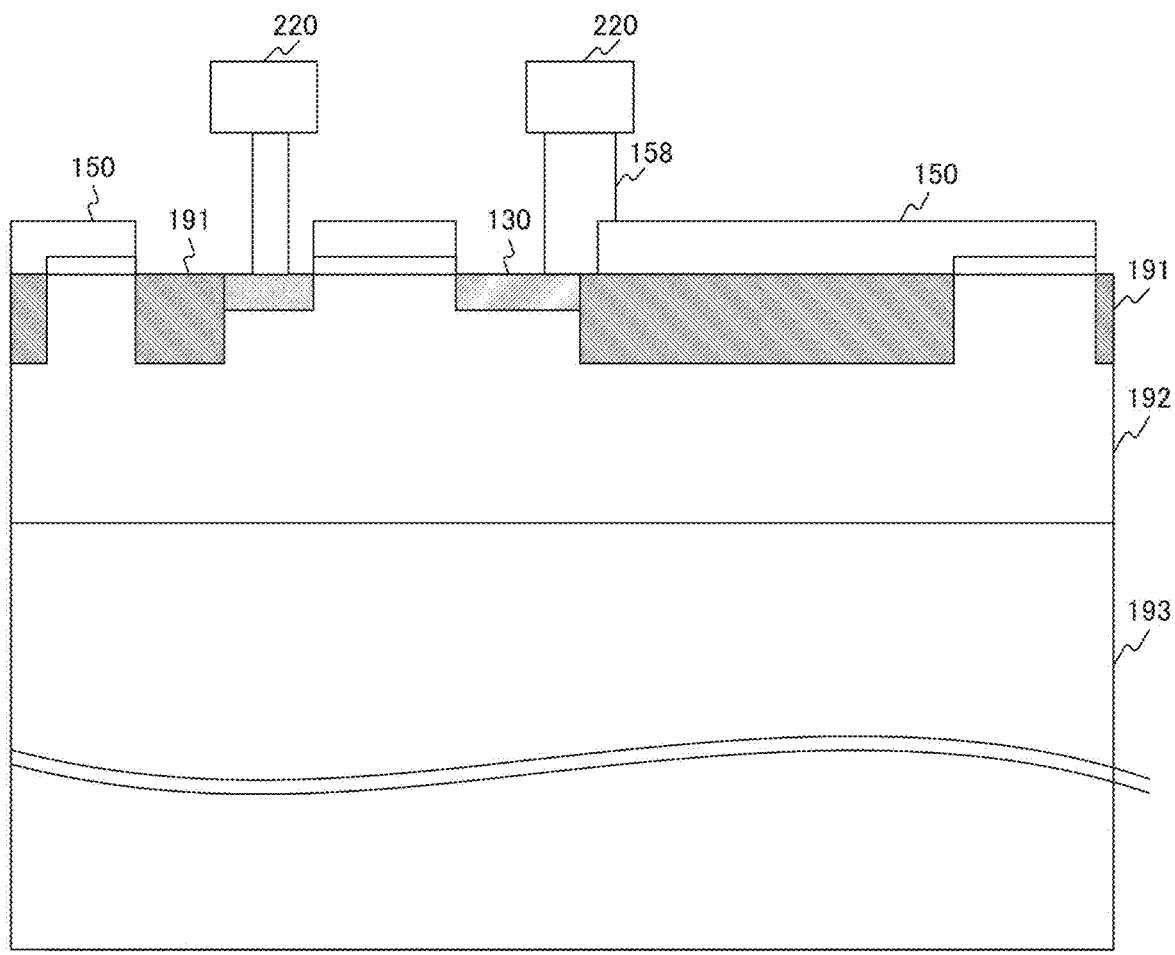
FIG. 24 is a diagram illustrating an example of another cross section of the solid-state imaging device around the pixel transistors according to the fourth embodiment of the present technology.

FIG. 24 is a diagram illustrating an example of another cross section of the solid-state imaging device around the pixel transistors according to the fourth embodiment of the present technology. This figure represents a cross section taken along a line B-B' in the plan view in FIG. 22.

In this fourth embodiment, the gate electrode of the amplification transistor 150 extends to the diffusion layer region of the source of the reset transistor 140. Then, the connection to the gate electrode of the amplification transistor 150 is made through the floating diffusion region 130 and the shared contact 158 formed in the diffusion layer region of the source of the reset transistor 140, and is electrically short-circuited.

As described above, in the fourth embodiment of the present technology, the reset transistor 140 is shared by two pixels on upper and lower sides in the 2×1 pixel arrangement structure. The gate electrode of the amplification transistor 150 is electrically short-circuited via the floating diffusion region 130 and the shared contact 158 formed in the diffusion layer region of the source of the reset transistor 140. Consequently, the contact of the floating diffusion region 130 and the contact of the gate electrode of the amplification transistor 150 are shared, and the number of contacts with the wiring layer 200 can be decreased.

5. Fifth Embodiment

In the third embodiment described above, a structure in which the reset transistor 140 is shared by two pixels on upper and lower sides is assumed. On the other hand, a fifth embodiment to be described here differs from the third embodiment described above in that a reset transistor 140 is shared by four pixels, assuming a 2×2 pixel arrangement structure. Note that the overall configuration and the circuit configuration as the solid-state imaging device are similar to those in the above-described first embodiment, and thus a detailed description thereof will be omitted.

[Structure of Solid-State Imaging Device]

Figure 25:
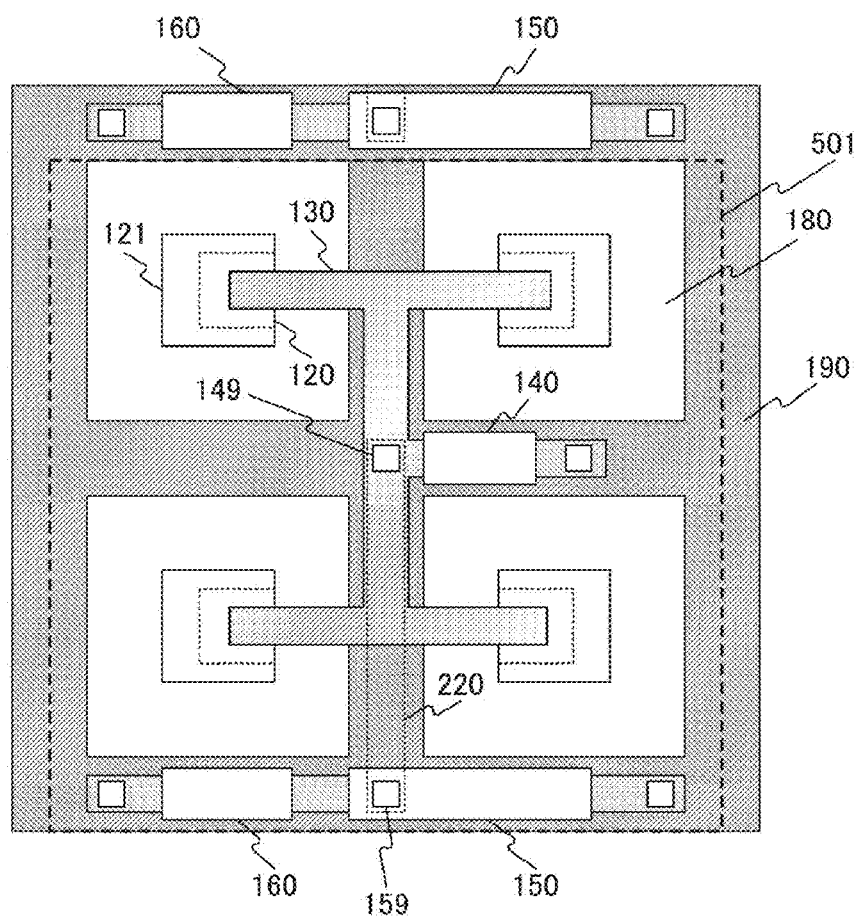
FIG. 25 is an example of a plan view of a semiconductor substrate 100 of a pixel 11 according to a fifth embodiment of the present technology.

FIG. 25 is an example of a plan view of a semiconductor substrate 100 of a pixel 11 according to the fifth embodiment of the present technology.

In this example, a structure 501 having a 2×2 pixel arrangement is employed, in which the reset transistor 140 is formed in an element isolation region at the center between four pixels and is shared. Furthermore, the amplification transistors 150 and select transistors 160 are disposed in element isolation regions on upper and lower sides on an outer periphery of the four pixels, and are shared. However, there is no inconsistency with the above-described first embodiment in that a transfer gate 120 is formed in a U-shaped column shape and a floating diffusion region 130 is shared with a diffusion layer region of a source of the reset transistor 140.

As described above, in the fifth embodiment of the present technology, the reset transistor 140 is shared between four pixels in the 2×2 pixel arrangement. Also in this case, it is not necessary to interpose a wiring layer 200 between the floating diffusion region 130 and the source of the reset transistor 140 for connection therebetween, such that the sizes of the floating diffusion region 130 and the transfer gate 120 can be reduced.

6. Sixth Embodiment

In the above-described fourth embodiment, a shared contact is used assuming a structure in which two pixels on upper and lower sides share the reset transistor 140. On the other hand, a sixth embodiment to be described here differs from the fourth embodiment described above in that a reset transistor 140 is shared by four pixels, assuming a 2×2 pixel arrangement structure. Note that the overall configuration and the circuit configuration as the solid-state imaging device are similar to those in the above-described first embodiment, and thus a detailed description thereof will be omitted.

[Structure of Solid-State Imaging Device]

Figure 26:
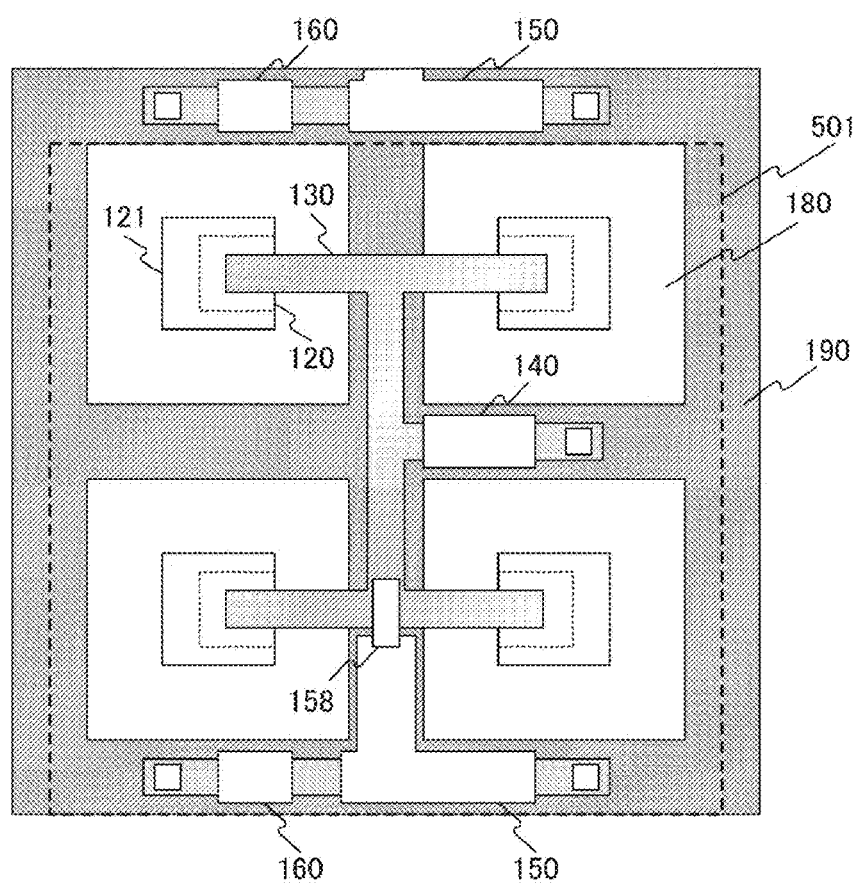
FIG. 26 is an example of a plan view of a semiconductor substrate 100 of a pixel 11 according to a sixth embodiment of the present technology.

FIG. 26 is an example of a plan view of a semiconductor substrate 100 of a pixel 11 according to the sixth embodiment of the present technology.

In this example, a structure 501 having a 2×2 pixel arrangement is employed, in which the reset transistor 140 is formed in an element isolation region at the center between four pixels and is shared. Furthermore, amplification transistors 150 and select transistors 160 are disposed in element isolation regions on upper and lower sides on an outer periphery of the four pixels, and are shared.

A gate electrode of the amplification transistor 150 has a shape extending to the vicinity of a floating diffusion region 130. Then, the gate electrode of the amplification transistor 150 is electrically short-circuited via a shared contact 158. However, there is no inconsistency with the above-described first embodiment in that a transfer gate 120 is formed in a U-shaped column shape and the floating diffusion region 130 is shared with a diffusion layer region of a source of the reset transistor 140.

As described above, in the sixth embodiment of the present technology, the reset transistor 140 is shared between four pixels in the 2×2 pixel arrangement. The gate electrode of the amplification transistor 150 is electrically short-circuited via the floating diffusion region 130 and the shared contact 158 formed in the diffusion layer region of the source of the reset transistor 140. Consequently, the contact of the floating diffusion region 130 and the contact of the gate electrode of the amplification transistor 150 are shared, and the number of contacts with a wiring layer 200 can be decreased.

7. Seventh Embodiment

In the above-described embodiments, it is assumed that the pixels 11 are isolated from each other using the trench 193. On the other hand, in a seventh embodiment to be described later, it is assumed that pixels 11 are isolated from each other by a deep trench structure passing through a silicon substrate.

[Structure of Solid-State Imaging Device]

Figure 27:
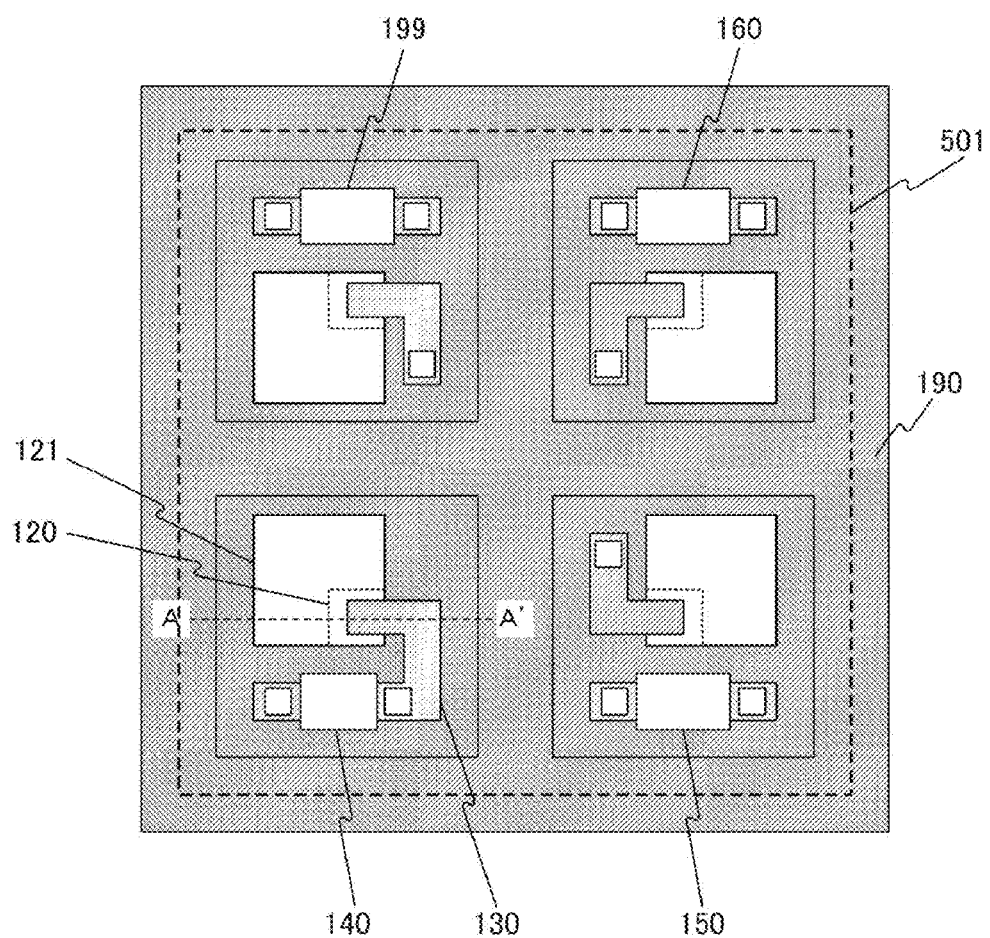
FIG. 27 is an example of a plan view of a semiconductor substrate 100 of a pixel 11 according to a seventh embodiment of the present technology.

FIG. 27 is an example of a plan view of a semiconductor substrate 100 of the pixel 11 according to the seventh embodiment of the present technology.

In this seventh embodiment, a deep trench structure passing through the silicon substrate from a front surface to a back surface is assumed, and the pixels 11 are electrically and optically isolated from each other. In this example, a structure 501 having a 2×2 pixel arrangement is employed, and each pixel is constituted by a transfer gate 120 and a pixel transistor. There is a total of four pixel transistors in the 2×2 pixel arrangement, and three of the four pixel transistors function as a reset transistor 140, an amplification transistor 150, and a select transistor 160. The remaining one transistor is a dummy and does not contribute to the operation as a circuit.

There is no inconsistency with the above-described embodiments in that the transfer gate 120 is formed in a U-shaped column shape and a floating diffusion region 130 is shared with a diffusion layer region of a source of the reset transistor 140.

Figure 28:
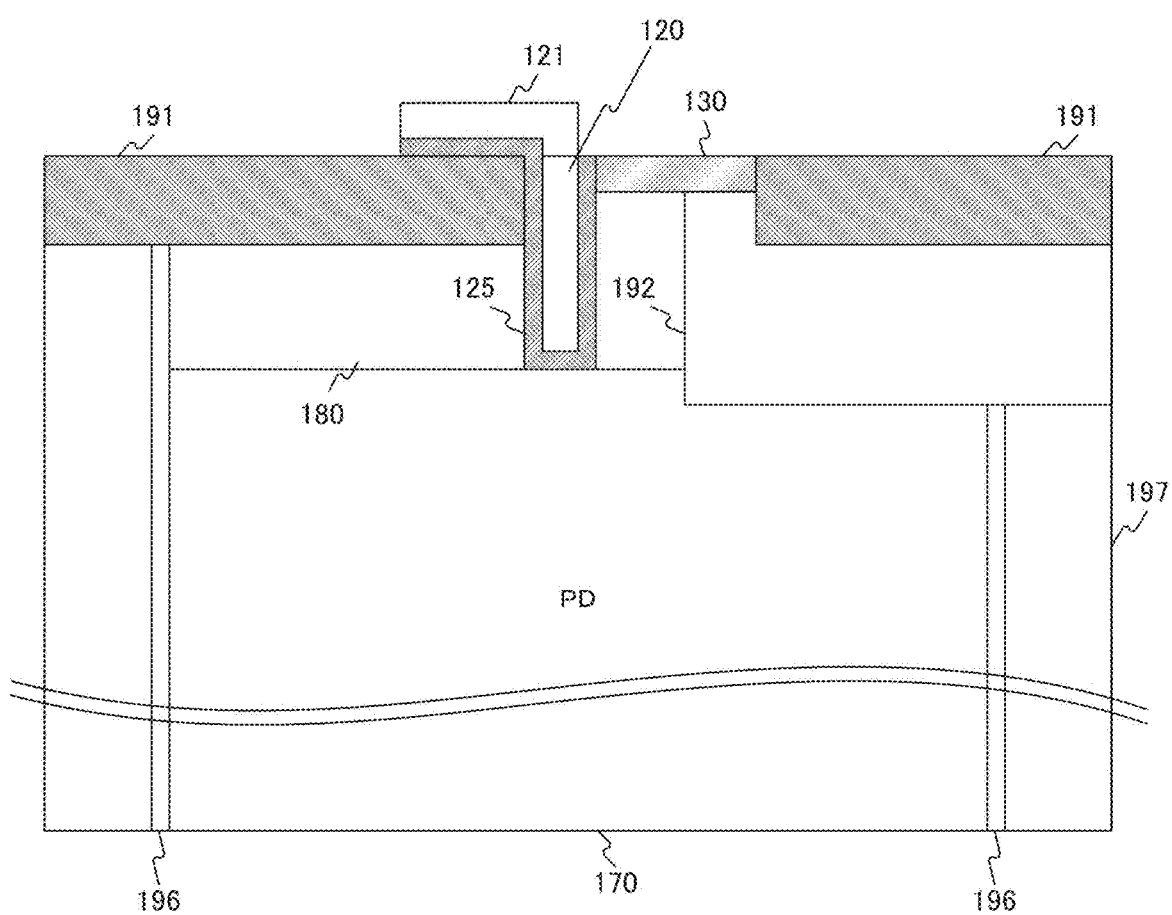
FIG. 28 is a diagram illustrating an example of a cross section of a solid-state imaging device around pixel transistors according to the seventh embodiment of the present technology.

FIG. 28 is a diagram illustrating an example of a cross section of a solid-state imaging device around the pixel transistors according to the seventh embodiment of the present technology. This figure represents a cross section taken along a line A-A' in the plan view in FIG. 27.

The floating diffusion region 130 extends to a region surrounded by a U-shaped opening of the transfer gate 120, and is shared with the diffusion layer region of the source of the reset transistor 140. The pixels 11 are electrically and optically isolated from each other by a deep trench 197 passing through the silicon substrate from a front surface to a back surface. A side wall of the deep trench 197 is covered by a P-type diffusion layer 196. This is to suppress a dark current produced on the side wall of the deep trench 197. Note that the deep trench 197 is an example of an element isolation portion described in the claims.

As described above, in the seventh embodiment of the present technology, pixels are electrically and optically isolated from each other by the deep trench 197 passing through the silicon substrate from a front surface to a back surface. Also in this case, it is not necessary to interpose a wiring layer 200 between the floating diffusion region 130 and the source of the reset transistor 140 for connection therebetween, such that the sizes of the floating diffusion region 130 and the transfer gate 120 can be reduced.

Note that the above-described embodiments illustrate examples for embodying the present technology and matters in the embodiments and invention specifying matters in the claims individually have correspondence relationships. Likewise, the invention specifying matters in the claims and the matters in the embodiments of the present technology denoted by the same names as those in the claims individually have correspondence relationships. However, the present technology is not limited to the embodiments and can be embodied by subjecting the embodiments to a variety of modifications without departing from the gist thereof. Note that the effects described in the present description merely serve as examples and not construed to be limited. Furthermore, there may be another effect as well.

In addition, the present technology can be also configured as described below.

(1) A solid-state imaging device including:

a photoelectric conversion unit that produces a charge according to incident light;

a transfer gate that has a columnar shape having an opening that is continuous in a vertical direction, and transfers the charge from the photoelectric conversion unit;

a floating diffusion unit that is formed extending to a region surrounded by the opening, and converts the transferred charge into a voltage signal; and a transistor electrically connected to the floating diffusion unit via a diffusion layer.

(2) The solid-state imaging device according to (1) above, in which the floating diffusion unit is formed integrally with the diffusion layer of the transistor.

(3) The solid-state imaging device according to (1) or (2) above, in which the transistor includes a reset transistor, and the diffusion layer of the transistor includes a diffusion layer of a source of the reset transistor.

(4) The solid-state imaging device according to any one of (1) to (3) above, further including a contact that electrically connects the floating diffusion unit and a wiring layer to each other.

(5) The solid-state imaging device according to (4) above, further including another transistor having a gate electrode electrically short-circuited to the floating diffusion unit via the contact.

(6) The solid-state imaging device according to any one of (1) to (5) above, in which the photoelectric conversion unit and the transfer gate are each provided for every pixel, and the floating diffusion unit and the transistor are shared by a plurality of pixels.

(7) The solid-state imaging device according to (6) above, in which the transistor is shared by two pixels on upper and lower sides, and is disposed in an element isolation region between the two pixels on the upper and lower sides.

(8) The solid-state imaging device according to (6) above, in which the transistor is shared by four pixels on upper, lower, left, and right sides, and is disposed in an element isolation region between any of the four pixels on the upper, lower, left, and right sides.

(9) The solid-state imaging device according to (6) above, further including:

a contact that electrically connects the floating diffusion unit and a wiring layer to each other; and another transistor that has a gate electrode that is electrically short-circuited to the floating diffusion unit via the contact, and is shared by the plurality of pixels.

(10) The solid-state imaging device according to (6) above, further including an element isolation portion having a trench shape that passes through a silicon substrate, and electrically and optically isolates the plurality of pixels from each other.

(11) A method of manufacturing a solid-state imaging device, the method including:

a procedure of providing a photoelectric conversion unit in correspondence with a pixel in a semiconductor substrate;

a procedure of forming a transfer gate above the photoelectric change unit, the transfer gate having a prismatic shape having an opening in a vertical direction; and a procedure of forming a diffusion layer shared with a transistor by implanting impurity ions into the opening.

(12) An electronic apparatus including:

a photoelectric conversion unit that produces a charge according to incident light;

a transfer gate that has a prismatic shape having an opening in a vertical direction, and transfers the charge from the photoelectric conversion unit;

a floating diffusion unit that is formed extending to a region surrounded by the opening, and converts the transferred charge into a voltage signal; and a transistor electrically connected to the floating diffusion unit via a diffusion layer.

REFERENCE SIGNS LIST

10 Pixel region
11 Pixel
12 Transfer transistor
13 Floating diffusion region
14 Reset transistor
15 Amplification transistor
16 Select transistor
17 Photodiode
20 Vertical drive circuit
30 Horizontal drive circuit
40 Control circuit
50 Column signal processing circuit
60 Output circuit
100 Semiconductor substrate
101 Insulating film
102 P-type semiconductor region
120 Transfer gate
121 Contact region
125 Gate insulating film
130 Floating diffusion region
140 Reset transistor
149 Contact
150 Amplification transistor
158 Shared contact
159 Contact
160 Select transistor
169 Contact
170 Photodiode
180 P-type semiconductor region
190 Element isolation region
191 Element isolation insulating film
192 P-type well
193 Trench
194 Plug P-type diffusion layer
196 P-type diffusion layer
197 Deep trench
200 Wiring layer
220 Metal wiring
230 Insulating layer
290 Support substrate
310 Microlens
320 Color filter
330 Planarization film
340 Light shielding film
410 Oxide film
411 Gate insulating film
420 SiN film
430 Resist
440 Polycrystalline silicon
460 Resist

The invention claimed is:

1. A solid-state imaging device, comprising:
a photoelectric conversion unit configured to produce a charge based on incident light;
a transfer gate with a columnar shape, wherein
the transfer gate includes an opening that is continuous in a vertical direction, and
the transfer gate is configured to transfer the charge from the photoelectric conversion unit;
a floating diffusion unit in a region surrounded by the opening included in the transfer gate, wherein the floating diffusion unit is configured to convert the transferred charge into a voltage signal; and
a transistor electrically connected to the floating diffusion unit via a diffusion layer.

2. The solid-state imaging device according to claim 1, wherein the floating diffusion unit is shared with the diffusion layer of the transistor.

3. The solid-state imaging device according to claim 1, wherein
the transistor includes a reset transistor, and
the diffusion layer of the transistor includes a diffusion layer of a source of the reset transistor.

4. The solid-state imaging device according to claim 1, further comprising a contact that electrically connects the floating diffusion unit and a wiring layer.

5. The solid-state imaging device according to claim 4, further comprising another transistor that includes a gate electrode electrically short-circuited to the floating diffusion unit via the contact.

6. The solid-state imaging device according to claim 1, wherein
the photoelectric conversion unit and the transfer gate are each provided for every pixel, and
the floating diffusion unit and the transistor are shared by a plurality of pixels.

7. The solid-state imaging device according to claim 6, wherein
the transistor is shared by two pixels on upper and lower sides, and is disposed in an element isolation region between the two pixels on the upper and lower sides.

8. The solid-state imaging device according to claim 6, wherein
the transistor is shared by four pixels on upper, lower, left, and right sides, and is disposed in an element isolation region between any of the four pixels on the upper, lower, left, and right sides.

9. The solid-state imaging device according to claim 6, further comprising:
a contact that electrically connects the floating diffusion unit and a wiring layer to each other; and
another transistor that has a gate electrode that is electrically short-circuited to the floating diffusion unit via the contact, and is shared by the plurality of pixels.

10. The solid-state imaging device according to claim 6, further comprising
an element isolation portion having a trench shape that passes through a silicon substrate, and electrically and optically isolates the plurality of pixels from each other.

11. A method of manufacturing a solid-state imaging device, the method comprising:
a procedure of providing a photoelectric conversion unit in correspondence with a pixel in a semiconductor substrate;
a procedure of forming a transfer gate above the photoelectric conversion unit, wherein
the transfer gate has a columnar shape, and
the transfer gate includes an opening that is continuous in a vertical direction; and
a procedure of forming a diffusion layer in a region surrounded by the opening included in the transfer gate, wherein the diffusion layer is shared with a transistor by implanting impurity ions into the opening.

* * * * *